(12) United States Patent
Yoshida et al.

(10) Patent No.: US 7,253,443 B2
(45) Date of Patent: Aug. 7, 2007

(54) ELECTRONIC DEVICE WITH INTEGRALLY FORMED LIGHT EMITTING DEVICE AND SUPPORTING MEMBER

(75) Inventors: Minako Yoshida, Tokyo (JP); Takahiro Yamaguchi, Tokyo (JP); Masayoshi Ichikawa, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/205,592

(22) Filed: Jul. 25, 2002

(65) Prior Publication Data

US 2004/0016930 A1     Jan. 29, 2004

(51) Int. Cl.
*H01L 27/15* (2006.01)
*H01L 31/12* (2006.01)
*H01L 33/00* (2006.01)

(52) U.S. Cl. .................. 257/80; 356/614; 257/E33.076
(58) Field of Classification Search .................. 257/79, 257/80–81, 82, 84, 86, 48; 250/559.3, 559.29, 250/559.31, 559.08; 356/399, 400, 401, 356/614–615, 620–623; 73/1.79, 653; 438/11, 438/14–16, 18; 324/752, 753
See application file for complete search history.

(56) References Cited

U.S. PATENT DOCUMENTS

| 4,422,547 A | * | 12/1983 | Abe et al. .................... 206/454 |
| 5,319,655 A | * | 6/1994 | Thornton .................... 372/23 |
| 5,600,130 A | * | 2/1997 | VanZeghbroeck ........ 250/214.1 |
| 5,739,585 A | * | 4/1998 | Akram et al. ................ 257/698 |
| 5,920,587 A | * | 7/1999 | Narui et al. ................ 372/50.1 |
| 6,097,748 A |   | 8/2000 | Huang et al. .................. 372/50 |
| 6,566,669 B2 | * | 5/2003 | Watanabe ................ 250/559.3 |
| 2002/0179903 A1 | * | 12/2002 | Seki |
| 2003/0006416 A1 | * | 1/2003 | Dudoff et al. ................ 257/79 |
| 2003/0183818 A1 | * | 10/2003 | Kim et al. |

FOREIGN PATENT DOCUMENTS

| JP | 02016779 A | * | 1/1990 |
| JP | 3-289700 |   | 12/1991 |
| JP | 4-102339 |   | 4/1992 |
| JP | 04199666 A | * | 7/1992 |
| JP | 406216358 A | * | 8/1994 |
| JP | 10-332345 |   | 12/1998 |

OTHER PUBLICATIONS

Patent Abstracts of Japan, Publication No. 03-289700, Dec. 19, 1991, 1 page.
Patent Abstracts of Japan, Publication No. 04-102339, Apr. 3, 1992, 1 page.
Patent Abstracts of Japan, Publication No. 10-332345, Dec. 18, 1998, 1 page.

* cited by examiner

*Primary Examiner*—B. William Baumeister
*Assistant Examiner*—Dana Farahani
(74) *Attorney, Agent, or Firm*—Osha Liang LLP

(57) ABSTRACT

An electronic device having a semiconductor circuit formed therein includes a semiconductor device in which the semiconductor circuit is formed; and a light emitting device, formed integrally with the semiconductor device, for emitting light indicating a reference position of the semiconductor device.

21 Claims, 22 Drawing Sheets

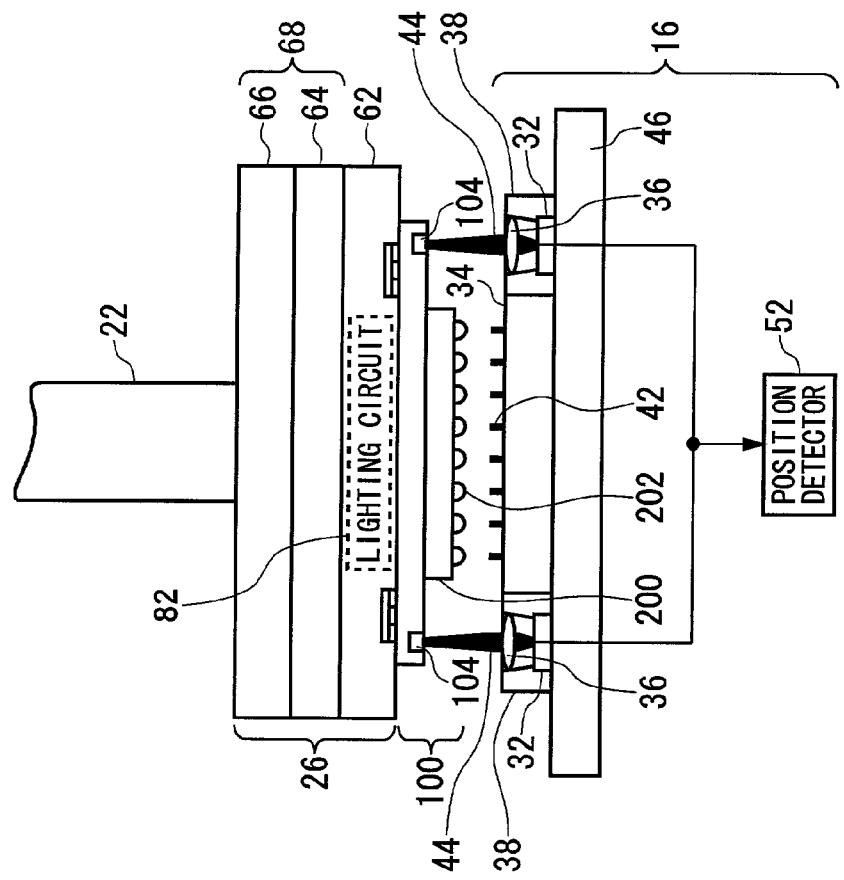
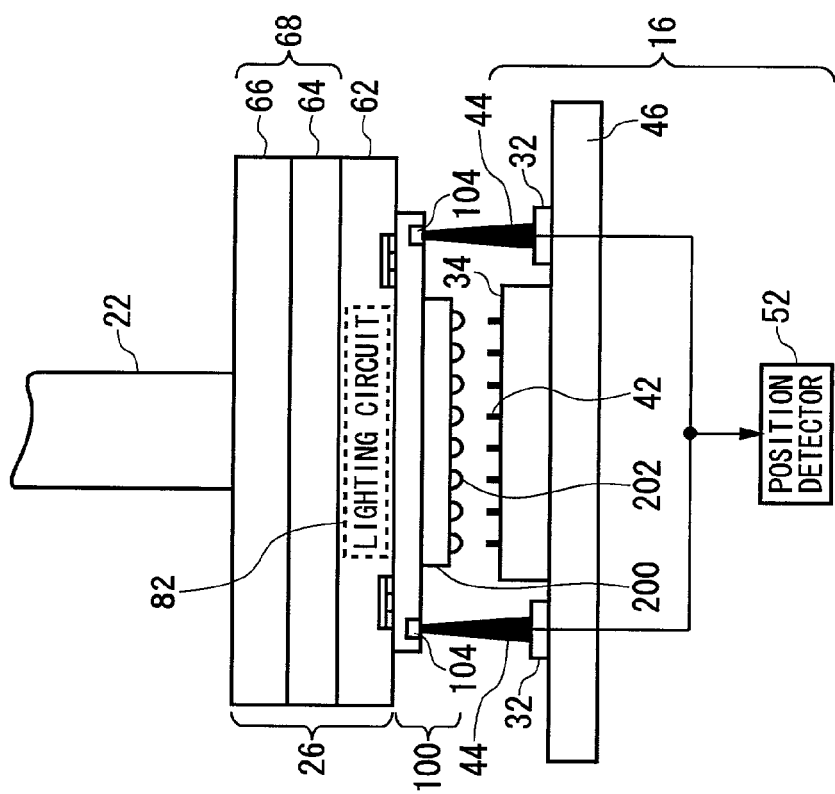
FIG. 3A
FIG. 3B

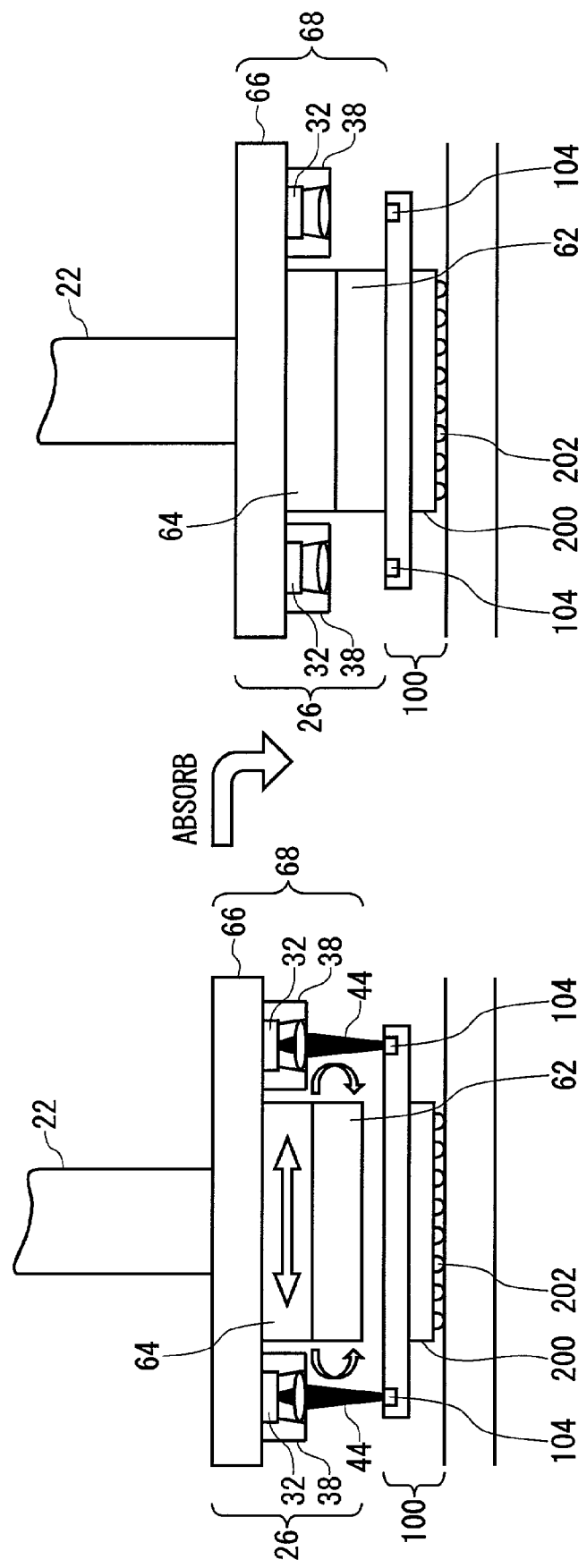

ELECTRONIC DEVICE WITH INTEGRALLY FORMED LIGHT EMITTING DEVICE AND SUPPORTING MEMBER

BACKGROUND OF THE INVENTION

1. Field of the Invention

The present invention relates to an electronic device and a holding member. More particularly, the present invention relates to an electronic device in which a semiconductor circuit is formed.

2. Description of the Related Art

In recent years, the number of terminals of an LSI has dramatically increased with increase of the degree of integration and increase of functions in the LSI, and therefore the space between the terminals of the LSI becomes narrower. An apparatus that performs positioning of the LSI in accordance with image processing techniques is conventionally known. This apparatus detects the position of the LSI based on an image of the LSI captured by illuminating the LSI with light from an external light source.

In some cases, however, the positions of the LSI cannot be detected appropriately because of unevenness in the light reflected from the LSI based on the difference of shape between the LSIs. For example, in a case of an LSI including BGA (Ball Grid Array) terminals that are arranged with a narrow pitch, the difference between the shapes of the respective terminals is large. Thus, the direction and intensity of the reflected light may be uneven.

Japanese Patent Application Laying-Open No. 3-289700 discloses a method in which an alignment mark is applied onto a substrate or the like. Japanese Patent Application Laying-Open No. 4-102339 discloses another method in which a solder bump is used as the alignment mark. Moreover, Japanese Patent Application Laying-Open No. 10-332345 discloses a method in which an image of the alignment mark is captured and is then subjected to image processing. Furthermore, U.S. Pat. No. 6,097,748 discloses a method in which a CMOS circuit is formed in a polysilicon layer on a GaAs substrate.

SUMMARY OF THE INVENTION

Therefore, it is an object of the present invention to provide an electronic device and a holding member, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, an electronic device in which a semiconductor circuit is formed, comprises: a semiconductor device having the semiconductor circuit formed therein; and a light emitting device, formed integrally with the semiconductor device, operable to emit light indicating a reference position of the semiconductor device.

The light emitting device may be placed on one of surfaces of the semiconductor device.

The light emitting device may be placed on a front surface of the semiconductor device.

The light emitting device may be placed on a back surface of the semiconductor device.

The semiconductor device may have an alignment mark at a position at which the light emitting device is placed.

The light emitting device may be monolithic with the semiconductor device.

A plurality of light emitting devices may be provided.

A lighting circuit of the light emitting device may be electrically independent of the semiconductor circuit.

The semiconductor device may be semiconductor wafer having a plurality of semiconductor circuits formed thereon that is to be separated into a plurality of chips, and the light emitting device may emit the light towards a light receiving device that is to detect a position of the semiconductor wafer.

The light emitting device may be formed in a cut-off region of the semiconductor wafer located outer than an area where the plurality of semiconductor circuits are formed.

The light emitting device may be placed on each of both surfaces of the semiconductor device.

The light emitting device may emit the light in a direction in which the light transmits the semiconductor device.

The semiconductor device may be a semiconductor chip cut from semiconductor wafer, and the light emitting device may emit the light towards a light receiving device that is to detect a position of the semiconductor chip.

The electronic device may further comprise a holding member, formed integrally with the light emitting device, operable to hold the semiconductor device at a predetermined position.

The holding member may hold the semiconductor device in a detachable manner.

The holding member may be a semiconductor substrate, and the light emitting device maybe monolithic with the holding member.

The holding member may be a semiconductor substrate, and the light emitting device may be placed on a surface of the holding member.

The light emitting device may be placed on the surface of the holding member in a detachable manner.

The holding member may have an alignment mark at a position at which the light emitting device is placed.

The holding member may be a package operable to accommodate the semiconductor device, and the light emitting device may be placed on the package.

According to the second aspect of the present invention, a fixing member for fixing a semiconductor device having a semiconductor circuit formed therein, comprises: a holding member operable to hold the semiconductor device at a predetermined position; and a light emitting device, formed integrally with the holding member, operable to emit light indicating a reference position of the semiconductor device.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3A shows an exemplary structure of a device holding unit 26 and an electronic device placing unit 16.

FIG. 3B shows an exemplary structure of the device holding unit 26 and the electronic device placing unit 16.

FIG. 14A shows an exemplary operation for adjusting a position of an adjustment moving unit 64.

FIG. 14B shows an exemplary operation for absorbing the electronic device 100.

FIG. 18A shows a side view of the electronic device 100.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
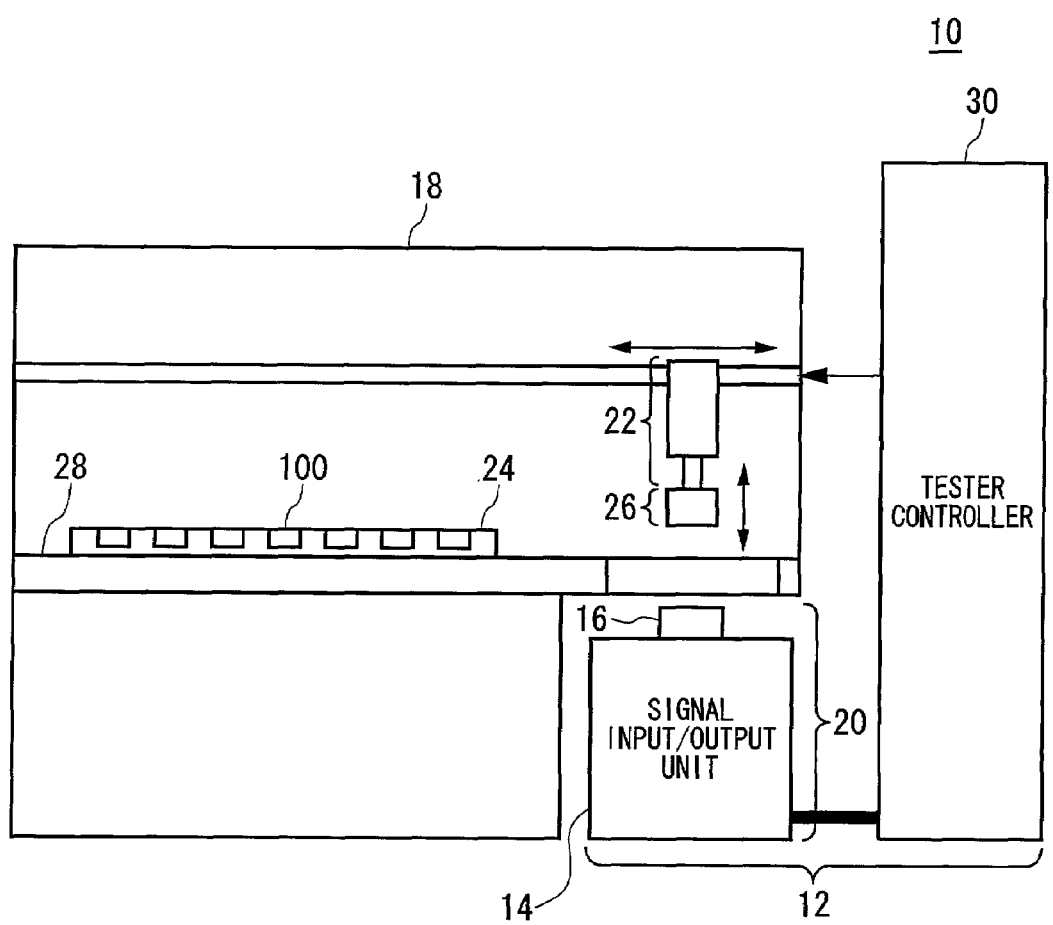
FIG. 1 shows a test system 10 as an example of an electronic device processing system according to an embodiment of the present invention.

FIG. 1 illustrates a test system 10 as an exemplary electronic device processing system according to an embodiment of the present invention. The test system 10 performs alignment of an electronic device 100 that is an exemplary electronic device with high precision and then tests the electronic device 100. The test system 10 includes a tester 12 and an electronic device carrying apparatus 18.

The tester 12 includes a test head 20 and a tester controller 30. The test head 20 includes an electronic device placing unit 16 and a signal input/output unit 14.

The electronic device placing unit 16 is electrically connected to the electronic device 100 and supplies a test pattern to the electronic device 100. The electronic device placing unit 16 may fix the electronic device 100 placed on the upper surface thereof, for example. In addition, the electronic device placing unit 16 receives an output signal output from the electronic device 100 in accordance with the test pattern, and supplies the output signal to the signal input/output unit 14.

The signal input/output unit 14 generates the test pattern and supplies it to the electronic device placing unit 16. Also, the signal input/output unit 14 receives the output signal of the electronic device 100 from the electronic device placing unit 16. Moreover, the electronic device placing unit 16 converts the output signal to a digital signal by a comparator or the like, so as to supply the digital signal to the tester controller 30.

The tester controller 30 controls the signal input/output unit 14 to generate the test pattern. The tester controller 30 also determines whether or not the electronic device 100 is defective based on the output signal of the electronic device 100 received from the signal input/output unit 14. In this way, the tester 12 performs a test for the electronic device 100.

The electronic device carrying apparatus 18 includes a tray 24, a device holding unit 26 and a moving unit 22. The tray 24 is arranged on a stage 28, on which a plurality of electronic devices 100 are placed. The device holding unit 26 picks up and holds one of the electronic devices 100 on the tray 24.

The moving unit 22 moves the device holding unit 26 that holds one electronic device 100 toward the electronic device placing unit 16. The device holding unit 26 then places the electronic device 100 on the electronic device placing unit 16. In this way, the electronic device carrying apparatus 18 picks up one of the electronic devices 100 one after another and places it on the electronic device placing unit 16.

After the test, the moving unit 22 moves the device holding unit 16 toward a classification tray (not shown) depending on the test result in accordance with an instruction from the tester controller 30. The device holding unit 26 places the electronic device 100 on the classification tray. According to the present embodiment, a plurality of electronic device 100 can be tested with high throughput and high efficiency.

In an alternative example, the electronic device processing system may be a lithography system, a dicing system, a packaging system, a bonding system or the like. The lithography system performs a lithography process, i.e., exposes the electronic device 100 such as semiconductor wafer with light. The dicing system cuts (dices) the electronic device 100 such as the semiconductor wafer into a plurality of semiconductor chips. The packaging system performs packaging for the electronic device such as the semiconductor device, i.e., accommodates the electronic device 100 into a package. The bonding system performs a bonding process, i.e., forms wiring between bonding pads of the electronic device 100 such as the semiconductor chip and the outside of the electronic device 100.

In any of the above-listed cases, the electronic device processing system may include the electronic device carrying apparatus 18 or may have the same or similar function as/to that of the electronic device carrying apparatus 18. In this way, it is possible to perform the lithography process, the dicing process, the packaging process, the bonding process or the like for a plurality of electronic devices 100 with high throughput and high efficiency.

Figure 2A:
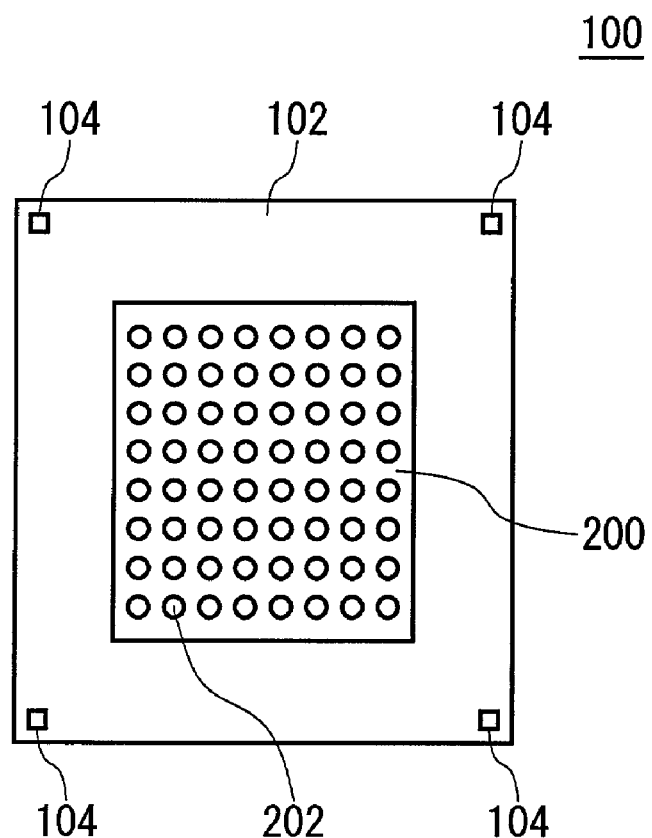
FIG. 2A shows a top view of an electronic device 100.
Figure 2B:
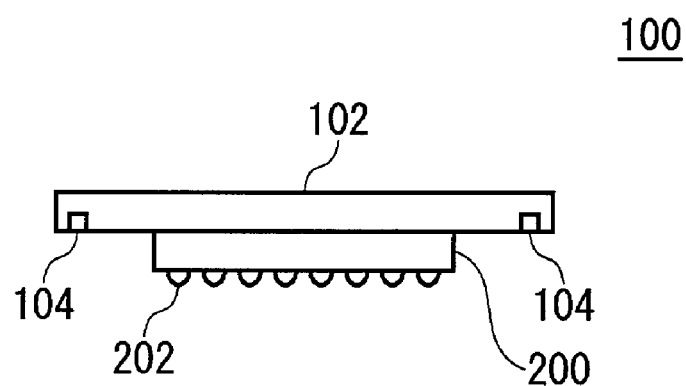
FIG. 2B shows a side view of an electronic device 100.

FIGS. 2A and 2B illustrate the detailed structure of the electronic device 100. FIG. 2A shows a top view of the electronic device 100 while FIG. 2B shows a side view thereof. The electronic device 100 includes a device under test 200, a substrate for alignment 102 and a plurality of laser devices 104.

The device under test 200 is a device to be tested by the tester 12 (see FIG. 1). In the present embodiment, the device under test 200 includes a plurality of terminals 202 each having a solder ball shape. The terminals 202 may be terminals of BGA (Ball Grid Array). During the test, the terminals 202 are electrically connected to the electronic device placing unit 16 (see FIG. 1), so that the device under test 200 receives a test pattern via the terminals 202 and outputs an output signal via the terminals 202.

The substrate for alignment 102 holds the device under test 200 at a predetermined position by bonding by flip-chip bonding, for example. In addition, the substrate for alignment 102 fixes the device under test 200 on a surface facing the electronic device placing unit 16 (the lower surface thereof).

It is preferable that the substrate for alignment 102 has an alignment mark that indicates a position at which the device under test 200 is to be fixed. In this case, it is possible to fix the substrate for alignment 102 with high precision, for example, accuracy of submicrons. Detection of the alignment mark and adjustment of a position at which the electronic device 100 is fixed may be performed by image processing based on an image obtained by capturing the substrate for alignment 102 and the electronic device 100, for example.

The laser device 104 may be a laser diode, for example, and is an example of a light emitting device indicating a reference position of the electronic device 100. In the present embodiment, the laser device 104 is a semiconductor laser formed on the substrate for alignment 102 by a semiconductor manufacturing process. In this case, it is possible to form the laser devices 104 at positions controlled with accuracy of submicrons to have the size in submicron order. Please note that the laser devices 104 are provided on the lower surface of the substrate for alignment 102 in the present embodiment.

The laser devices 104 and the device under test 200 are fixed at positions controlled with high precision with respect to the substrate for alignment 102. Moreover, each laser device 104 emits light indicating the reference position of the electronic device 100. Thus, according to the present embodiment, it is possible to detect the position of the electronic device 100 with high precision based on this light. Therefore, it is also possible to detect the position of the device under test 200 with high precision. Please note that the electronic device placing unit 16 detects the position of the device under test 200 in the present embodiment.

Moreover, the electronic device 100 includes a plurality of laser devices 104. Thus, the electronic device placing unit 16 can detect the position of the device under test 200 in a horizontal plane with high precision. The electronic device placing unit 16 may detect, as the position of the device under test 200, X- and Y-coordinates of the center of the device under test 200 and a rotation angle of the device under test 200 in the horizontal plane.

It is more preferable that the electronic device 100 includes three or more laser devices 104. In this case, the electronic device placing unit 16 can further detect a tilt angle of the device under test 200 with respect to the horizontal plane, for example.

Please note that it is preferable to form a plurality of laser devices 104 symmetrically with respect to the device under test 200. In this case, the center of gravity and the rotation angle of the device under test 200 can be detected easily.

The laser device 104 may be formed in the vicinity of the terminal 202 through which a high-speed signal is input and output. In this case, it is possible to detect the position of this terminal 200 with higher precision. Therefore, the alignment of this terminal 200 can be performed with higher precision and the device under test 200 can be placed on the electronic device placing unit 16.

The electronic device 100 may include a large-sized laser device 104 and a small-sized laser device 104. The large-sized laser device 104 emits light having the larger intensity and the larger spot size, while the small-sized laser device 104 emits light having the smaller intensity and the smaller spot size. In this case, it is possible to roughly detect the position of the device under test 200 based on the light emitted from the large-sized laser device 104 and then precisely detect that position based on the light emitted from the small-sized laser device 104. Thus, in this case, the position of the device under test 200 can be detected efficiently.

FIGS. 3A and 3B show the detailed structure of the device holding unit 26 and the electronic device placing unit 16. The device holding unit 26 includes an electronic device fixing unit 62 and a position adjusting unit 68. The electronic device fixing unit 62 fixes the electronic device 100 picked up from the tray 24 (see FIG. 1) by, for example, absorption. The electronic device fixing unit 62 further includes a lighting circuit 82. The lighting circuit 82 supplies power to the laser device 104 so as to emit light.

The position adjusting unit 68 adjusts the position of the electronic device 100 by moving the electronic device fixing unit 62 for fixing the electronic device 100 in the horizontal direction, thereby making alignment with respect to the electronic device placing unit 16. In the present embodiment, the position adjusting unit 68 includes an adjustment fixing unit 66 and an adjustment moving unit 64. The adjustment fixing unit 66 is fixed with respect to the moving unit 22 so as to hold the adjustment moving unit 64 movably in the horizontal direction. The adjustment moving unit 64 fixes the electronic device fixing unit 62, and makes translation and rotation in the horizontal plane with respect to the adjustment fixing unit 66. In this way, the adjustment moving unit 64 causes translation and rotation of the electronic device fixing unit 62 in the horizontal plane.

The electronic device placing unit 16 includes a socket base 46, a socket 34, an optical detector 32 and a position detector 52. In the present embodiment, the electronic device placing unit 16 includes a plurality of optical detectors 32 which respectively correspond to a plurality of laser devices 104.

The socket base 46 fixes the socket 34 and the optical detectors 32 that are placed thereon. The socket 34 includes socket pins 42 that can be electrically connected to the terminals 202 of the device under test 200, and supplies a test pattern to the device under test 200 via the socket pins 42 and receives the output signal of the device under test 200 via the socket pins 42.

The optical detectors 32 are an exemplary light receiving device included in the position detector 52. Each of the optical detectors 32 is arranged at a position that is to be directly below the corresponding one of the laser devices 104, so as to detect the light emitted from the corresponding laser device 104. In the present embodiment, the optical detectors 32 are position sensitive devices. In an alternative example, the optical detectors 32 may be CCD area sensors or a two-dimensional photodiode array, for example.

The position detector 52 detects the position of each laser device 104 based on an intensity distribution signal detected by the corresponding optical detector 32, and detects the position of the electronic device 100 based on the detected positions of the laser devices 104. In addition, the position detector 52 detects the position of the device under test 200 from that detection result. The adjustment moving unit 64 then makes translation and/or rotation in the horizontal plane based on the detected position of the device under test 200. Thus, the adjustment moving unit 64 adjusts the position of the device under test 200 with respect to the socket 34. Therefore, according to the present embodiment, it is possible to adjust the position of the device under test 200 with respect to the socket 34 with high precision.

FIG. 3A shows an exemplary structure of the device holding unit 26 and the electronic device placing unit 16 in a case where the optical detectors 32 directly receive the light emitted from the associated laser devices 104, respectively. FIG. 3B shows an exemplary structure of the device holding unit 26 and the electronic device placing unit 16 in a case where the optical detectors 32 receive the light emitted from the associated laser devices 104 via lenses 36, respectively.

In the case shown in FIG. 3B, the electronic device placing unit 16 includes lens holding members 38 and the lenses 36. Each lens holding member 38 holds the corresponding lens 36. The lens 36 converges the emitted light 44. In this case, it is possible to make the emitted light 44 having the small spot size incident on the corresponding optical detector 32. In addition, due to this arrangement, the position detector 52 can detect the positions of the laser devices 104 with high precision.

Figure 4A:
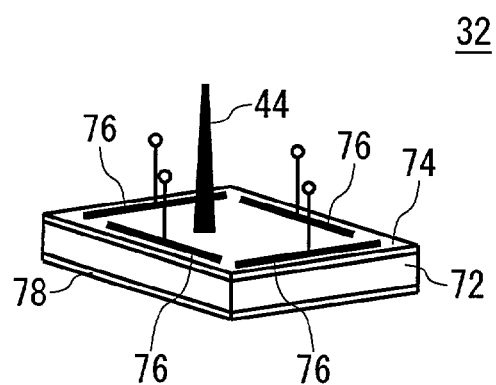
FIG. 4A shows a perspective view of an optical detector 32.
Figure 4B:
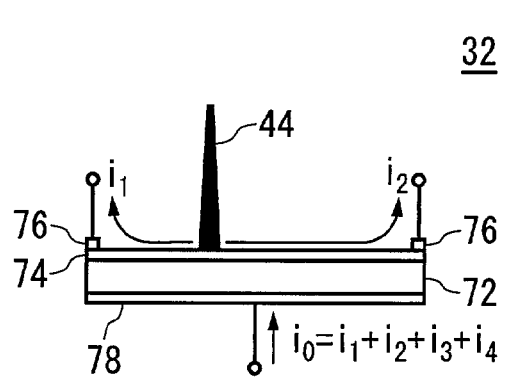
FIG. 4B shows a side view of the optical detector 32.

FIGS. 4A and 4B show the detailed structure of the optical detector 32. FIG. 4A shows a perspective view of the optical detector 32, while FIG. 4B shows a side view thereof.

The optical detector 32 includes a silicon substrate 72, a resistance layer 74, a plurality of surface electrodes 76 and a back electrode 78. The silicon substrate 72 is a semiconductor substrate doped to be a P-type or N-type substrate. In the present embodiment, the silicon substrate 72 has an approximately rectangular shape in which the surface is approximately square. The resistance layer 74 is a thin layer formed on the surface of the silicon substrate 72 and receives the emitted light 44. Moreover, the resistance layer 74 is electrically joined with the silicon substrate 72 by PN junction. The back electrode 78 is an electrode that is electrically connected to the silicon substrate 72 on the back of the surface having the resistance layer 74 formed thereon.

Each of the surface electrodes 76 is formed to be electrically independent of other surface electrodes 76 on the surface of the resistance layer 74 having the approximately square shape in the vicinity of the respective side of the square. In addition, each of the surface electrodes 76 is electrically connected to the resistance layer 74. Thus, the resistance layer 74 has a function as a current divided and diffused resistance layer.

Here, a case where the emitted light 44 is incident on the optical detector 32 is considered. In this case, the PN junction between the silicon substrate 72 and the resistance layer 74 generates an optical current $I_0$. The optical current $I_0$ is then divided into currents $I_1$ to $I_4$ depending on the distances from the position of incidence of the emitted light 44 to the respective surface electrodes 76. In this case, the position detector 52 (see FIG. 3) can detect the position of incidence of the emitted light 44 based on a ratio of the currents $I_1$ to $I_4$.

If the optical detector 32 is a CCD area sensor or two-dimensional photodiode array, the optical detector 32 detects the intensity distribution of the emitted light 44. In this case, the position detector 52 may detect the position of the median point of the intensity distribution or the peak thereof as the incident position of the emitted light 44.

Figures 5A, 5B:
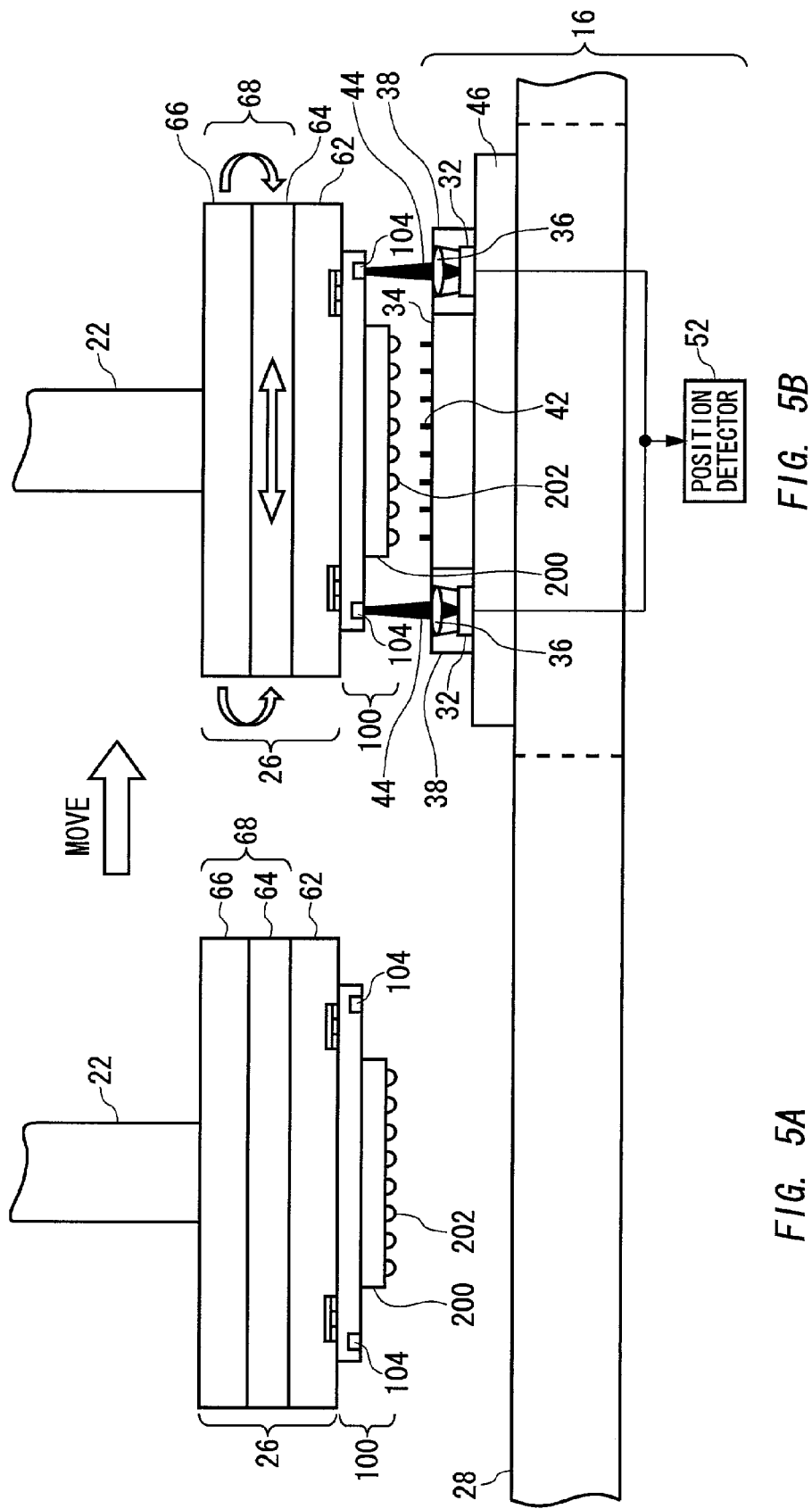
FIG. 5A shows the device holding unit 26 that is moving.
FIG. 5B shows the device holding unit 26 during adjustment of a position of a device under test 200.

FIGS. 5A and 5B are diagrams that explain an exemplary operation of the device holding unit 26. FIG. 5A shows the device holding unit 26 which is moving while holding the electronic device 100. The device holding unit 26 picks up one electronic device 100 from the tray 24 (see FIG. 1) and moves toward the electronic device placing unit 16.

FIG. 5B shows the device holding unit 26 during the adjustment of the position of the device under test 200 with respect to the socket 34. The device holding unit 26 stops moving at a predetermined position in the vicinity of the socket 34 and turns on the laser device 104. Then, the optical detectors 32 detect the incident positions of the corresponding emitted light 44. Based on the result of this detection, the position detector 52 detects the position of the electronic device 100. The adjustment moving unit 64 then makes translation and/or rotation in the horizontal plane in accordance with the result of the detection by the position detector 52, thereby adjusting the position of the electronic device 100. In this way, it is possible to adjust the position of the device under test 200 fixed to the electronic device 100 with respect to the socket 34.

According to the present embodiment, it is possible to adjust the position of the device under test 200 with high precision so as to connect the device under test 200 to the socket 34. It should be noted that the electronic device placing unit 16 moves upwards toward the device holding unit 26. Thus, the device under test 200 is connected to the socket 34 within the electronic device carrying apparatus 18. In an alternative example, the device holding unit 26 may move downwards toward the electronic device placing unit 16.

Figure 6A:
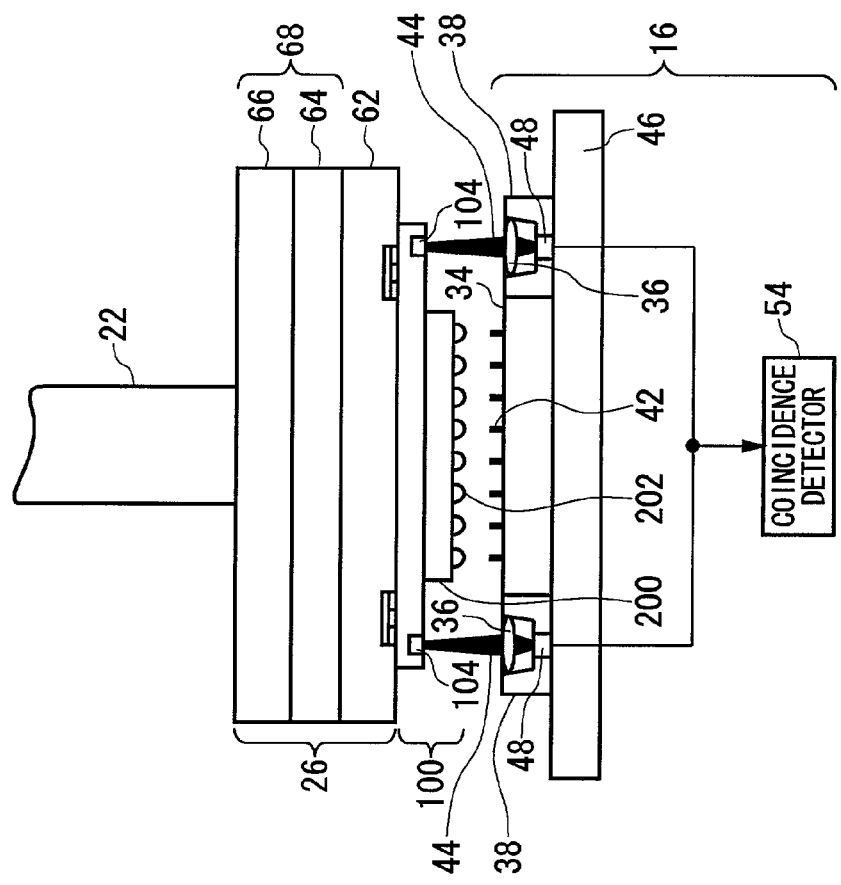
FIG. 6A shows an exemplary structure of the device holding unit 26 and the electronic device placing unit 16.
Figure 6B:
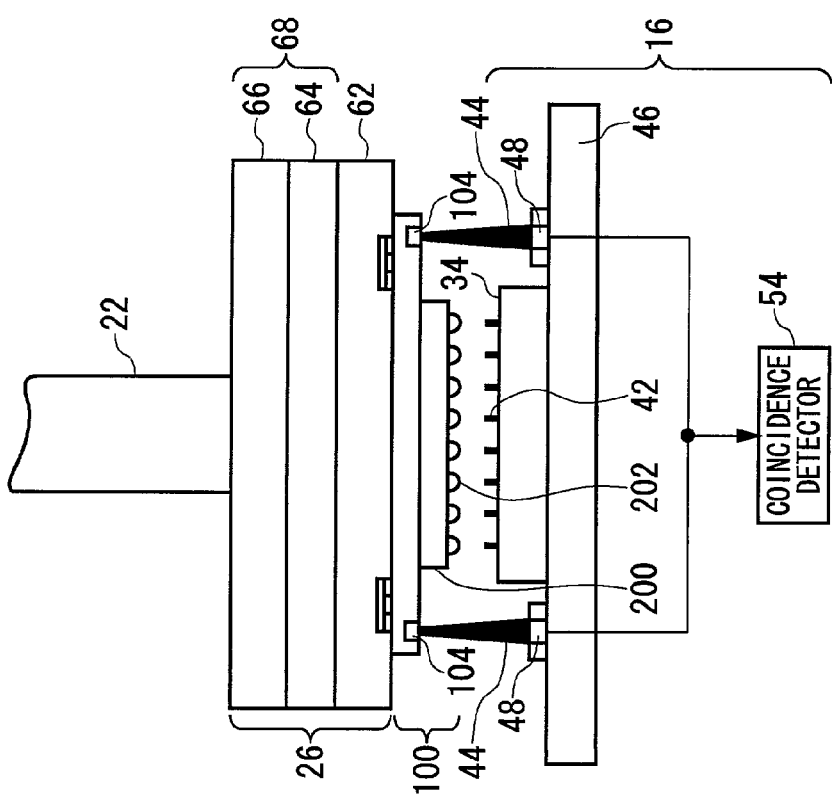
FIG. 6B shows an exemplary structure of the device holding unit 26 and the electronic device placing unit 16.

FIGS. 6A and 6B show another detailed structure of the device holding unit 26 and the electronic device placing unit 16. FIG. 6A shows an exemplary structure of the device holding unit 26 and the electronic device placing unit 16 in a case where photodiodes 48 directly receive light emitted from the associated laser devices 104, respectively. FIG. 6B shows an exemplary structure of the device holding unit 26 and the electronic device placing unit 16 in a case where the photodiodes 48 receive the light emitted from the associated laser devices 104 via the lenses 36, respectively. In FIGS. 6A and 6B, the components labeled with the same reference numerals as those in FIGS. 3A and 3B have the same or similar functions as/to the components shown in FIGS. 3A and 3B, and therefore the description thereof is omitted. In this example, the electronic device placing unit 16 includes the photodiodes 48 and a coincidence detector 54. The coincidence detector 54 is an example of the position detector for detecting the position of the electronic device 100, and the photodiode 48 is an example of the light receiving device included in the position detector.

Each photodiode 48 outputs a signal depending on the incident intensity of the emitted light 44 incident thereon. The coincidence detector 54 detects the coincidence of the center of the distribution of the emitted light 44 with the center of the photodiode 48 based on the output signal of the photodiode 48. If the emitted light 44 is converged by the lens 36, the coincidence can be detected with higher precision in this case.

Since the distribution of the emitted light 44 is Gaussian distribution, the output of the photodiode 48 becomes the maximum when the distribution center of the emitted light 44 is coincident with the center of the photodiode 48. The coincidence detector 54 may detect the coincidence when the outputs of a plurality of photodiodes 48 are a predetermined value or more.

Moreover, the electronic device placing unit 16 in this example includes a plurality of photodiodes 48 that respectively correspond to a plurality of laser devices 104. The coincidence detector 54 detects, for each of the photodiodes 48, the coincidence of the center of the photodiode 48 with the distribution center of the corresponding emitted light 44. Thus, the coincidence detector 54 detects the coincidence of the position of the electronic device 100 with a desired position.

The coincidence detector 54 may detect the coincidence of the position of the electronic device 100 with the desired position when it is detected for all the photodiodes 48 that the centers of the photodiodes 48 are coincident with the distribution centers of the associated emitted light 44, respectively. By detecting the coincidence of the position of the electronic device 100 with the desired position, the coincidence detector 54 detects the position of the electronic device 100. Also in this case, it is possible to adjust the position of the device under test 200 with high precision based on the result of the position detection, thereby connecting the device under test 200 to the socket 34.

In an alternative example, the electronic device placing unit 16 may further includes a slit (not shown) that covers the incident face of the photodiode 48. In this case, by extracting a uniform part of the intensity distribution of the emitted light 44, selectivity of the intensity of the intensity distribution can be improved. Moreover, this allows the position of the electronic device 100 to be detected with higher precision.

Figure 7:
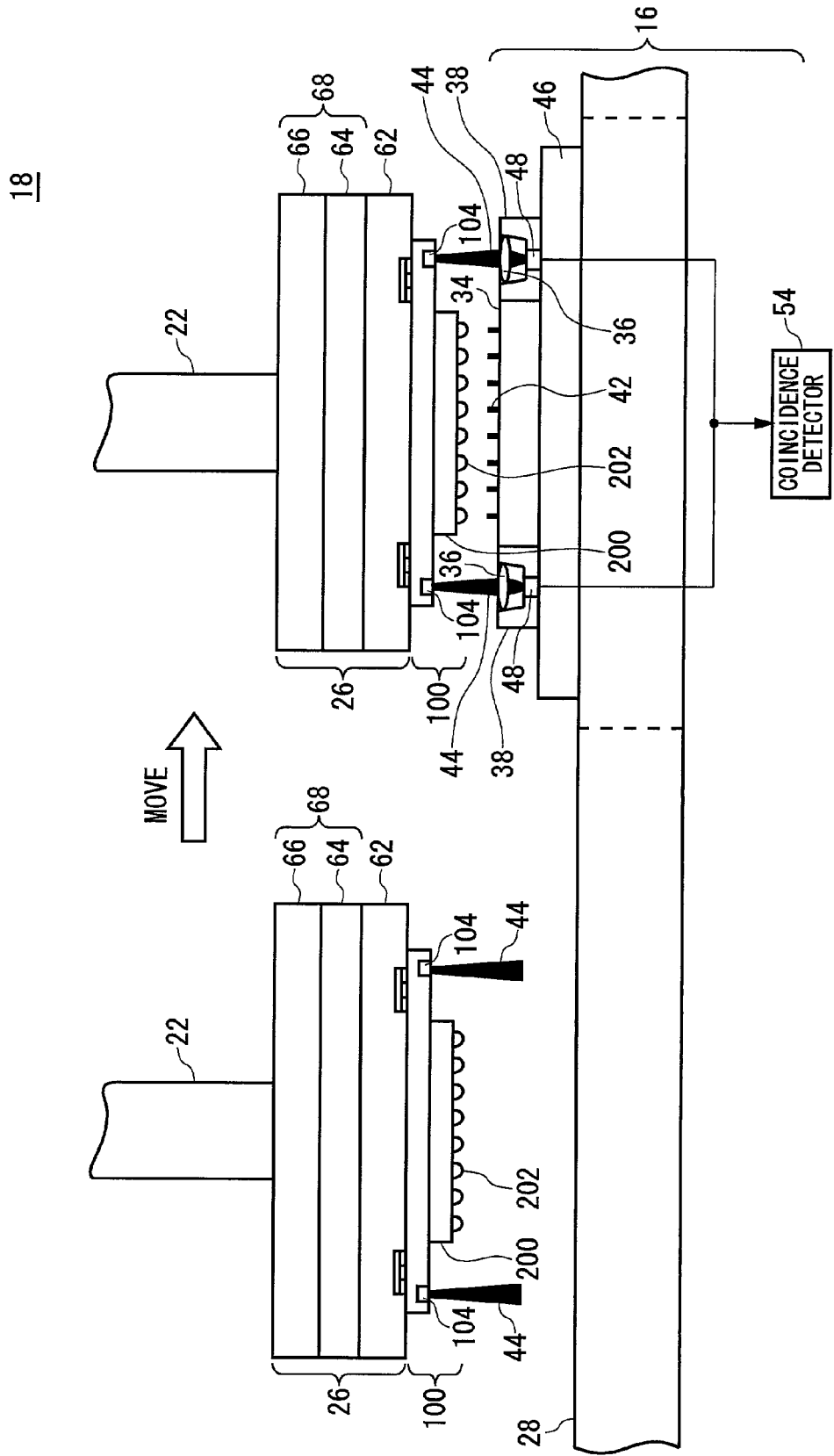
FIG. 7 is a diagram that explains an exemplary operation of the device holding unit 26.

FIG. 7 is a diagram that explains an exemplary operation of the device holding unit 26 described referring to FIGS. 6A and 6B. In this example, the device holding unit 26 that holds the electronic device 100 moves toward the electronic device placing unit 16 while lighting the laser device 104. The coincidence detector 54 receives the output signals of the photodiodes 48 during a period in which the device holding unit 26 is moving, and detects the coincidence of the position of the electronic device 100 with a desired position based on the received output signal.

When the coincidence detector 54 has detected the coincidence of the position of the electronic device 100 with the desired position, the device holding unit 26 stops moving. Also in this case, the position of the electronic device 100 can be detected with high precision. Moreover, it is therefore possible to adjust the position of the device under test 200 with high precision.

Figure 8:
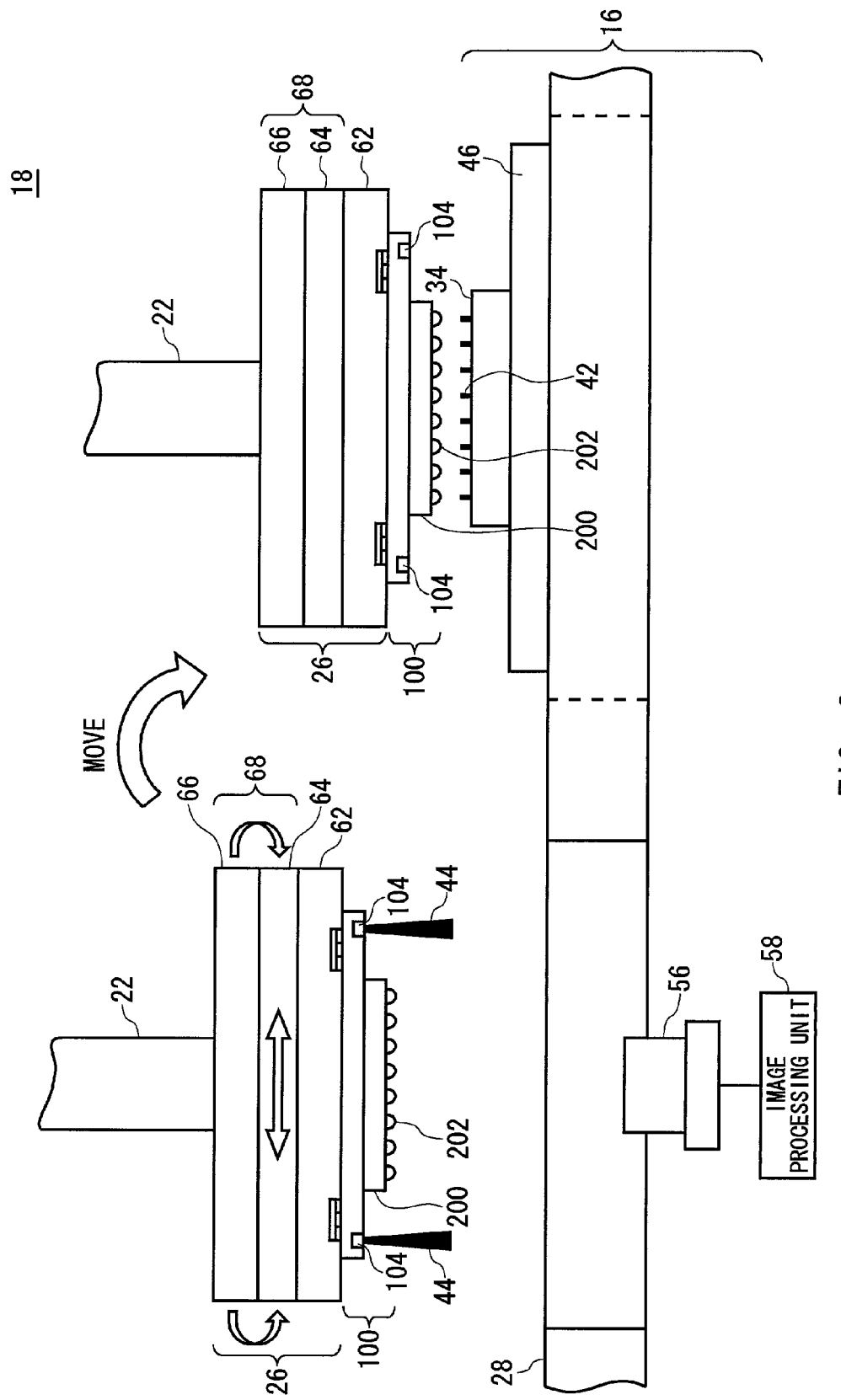
FIG. 8 shows another exemplary structure of an electronic device carrying apparatus 18.

FIG. 8 shows another example of the structure of the electronic device carrying apparatus 18. In this example, the electronic device carrying apparatus 18 further includes a capturing unit 56 and an image processing unit 58. In FIG. 8, the components labeled with the same reference numerals as those in FIGS. 3A and 3B have the same or similar functions as/to those in FIGS. 3A and 3B, and therefore the description thereof is omitted.

The capturing unit 56 captures the emitted light 44 from the laser device 104. The image processing unit 58 performs image processing based on the image captured by the capturing unit 56, thereby detecting the position of the laser device 104.

The intensity distribution of the emitted light 44 is Gaussian distribution. Thus, the image processing unit 58 may detect the position of the laser device 104 based on the peak or median point of pixel values in a region of the image captured by the capturing unit 56, the region corresponding to the laser device 104. Moreover, the image processing unit 58 may detect the center of a region where the pixel values are larger (brighter) than a predetermined value, as the position of the laser device 104.

The image processing unit 58 detects the position of each of a plurality of laser devices 104, there by detecting the position of the electronic device 100. According to this example, the position of the electronic device 100 can be detected with high precision. Moreover, the image processing unit 58 may calculate an error between the detected position of the electronic device 100 and a desired position and calculate the amount of moving and/or rotation of the electronic device 100 based on the thus calculated error.

In the present example, the device holding unit 26 that holds the electronic device 100 moves to be positioned above the capturing unit 56 and then turns on the laser device 104. The capturing unit 56 then captures the emitted light 44 from the laser device 104, and the image processing unit 58 detects the position of the electronic device 100 based on the thus captured image. The adjustment moving unit 64 then makes translation and/or rotation in the horizontal plane based on the result of the detection by the image processing unit 58, thereby adjusting the position of the electronic device 100.

Please note that the capturing unit 56 may perform the capturing operation again after the translation and/or rotation of the adjustment moving unit 64. In this case, it is preferable that the image processing unit 58 determines whether or not the electronic device 100 was moved to the desired position by the moving of the adjustment moving unit 64. If the image processing unit 58 determines that the electronic device 100 was not moved to the desired position, the adjustment moving unit 64 may make translation and/or rotation again. In this case, the position of the electronic device 100 can be adjusted with higher precision.

After the adjustment, the device holding unit 26 moves toward the electronic device placing unit 16, and the electronic device placing unit 16 moves upwards so as to connect the device under test 200 to the socket 34. Also in this case, it is possible to adjust the position of the electronic device 100 with high precision and to connect the device under test 200 to the socket 34.

Please note that the image processing unit 58 may detect the position of the laser device 104 by an operation using a threshold value, for example. In this case, the image processing unit 58 may convert the image captured by the capturing unit 56 into a binary image based on a predetermined threshold value, so as to extract a region of the image based on the binary image. The image processing unit 58 may detect the position of the laser device 104 by pattern matching. In this case, the image processing unit 58 may detect the position of the laser device 104 based on the degree of coincidence of the image captured by the capturing unit 56 with a template image.

Figure 9:
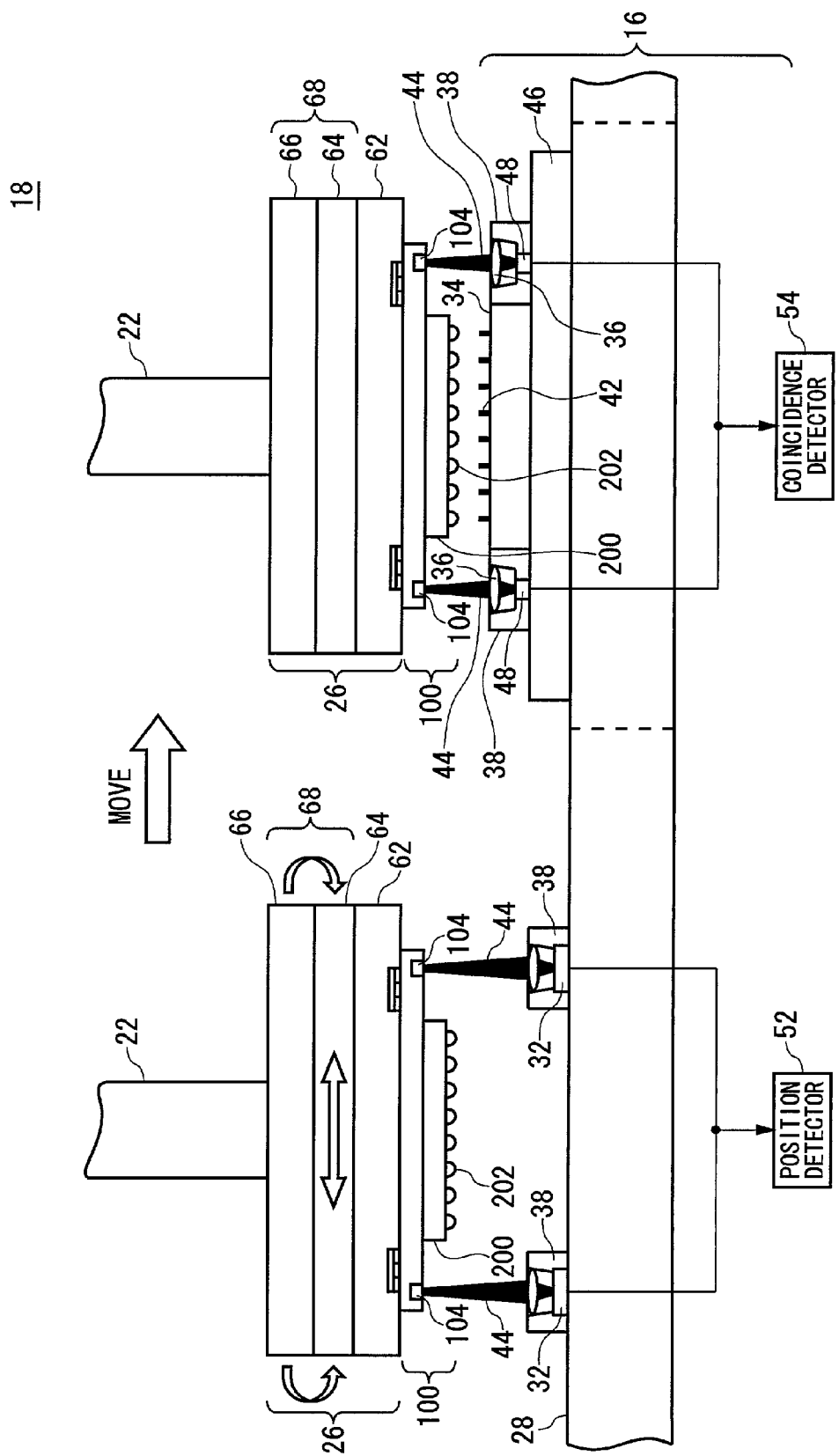
FIG. 9 shows still another exemplary structure of the electronic device carrying apparatus 18.

FIG. 9 shows still another example of the structure of the electronic device carrying apparatus 18. In this example, the electronic device carrying apparatus 18 further includes a plurality of optical detectors 32 and a position detector 52. Moreover, the electronic device placing unit 16 includes a plurality of photodiodes 48 and a coincidence detector 54. In FIG. 9, the components labeled with the same reference numerals as those in FIGS. 6A and 6B have the same or similar functions as/to those in FIGS. 6A and 6B, and therefore the description thereof is omitted.

In this example, the device holding unit 26 that holds the electronic device 100 moves to be positioned above the optical detectors 32 included in the electronic device carrying apparatus 18 and adjusts the position of the electronic device 100. Then, the device holding unit 26 moves to position above the electronic device placing unit 16, and the coincidence detector 54 detects the coincidence of the position of the electronic device 100 with a desired position. According to the present example, the position of the electronic device 100 can be detected with high precision without fail.

Figure 10:
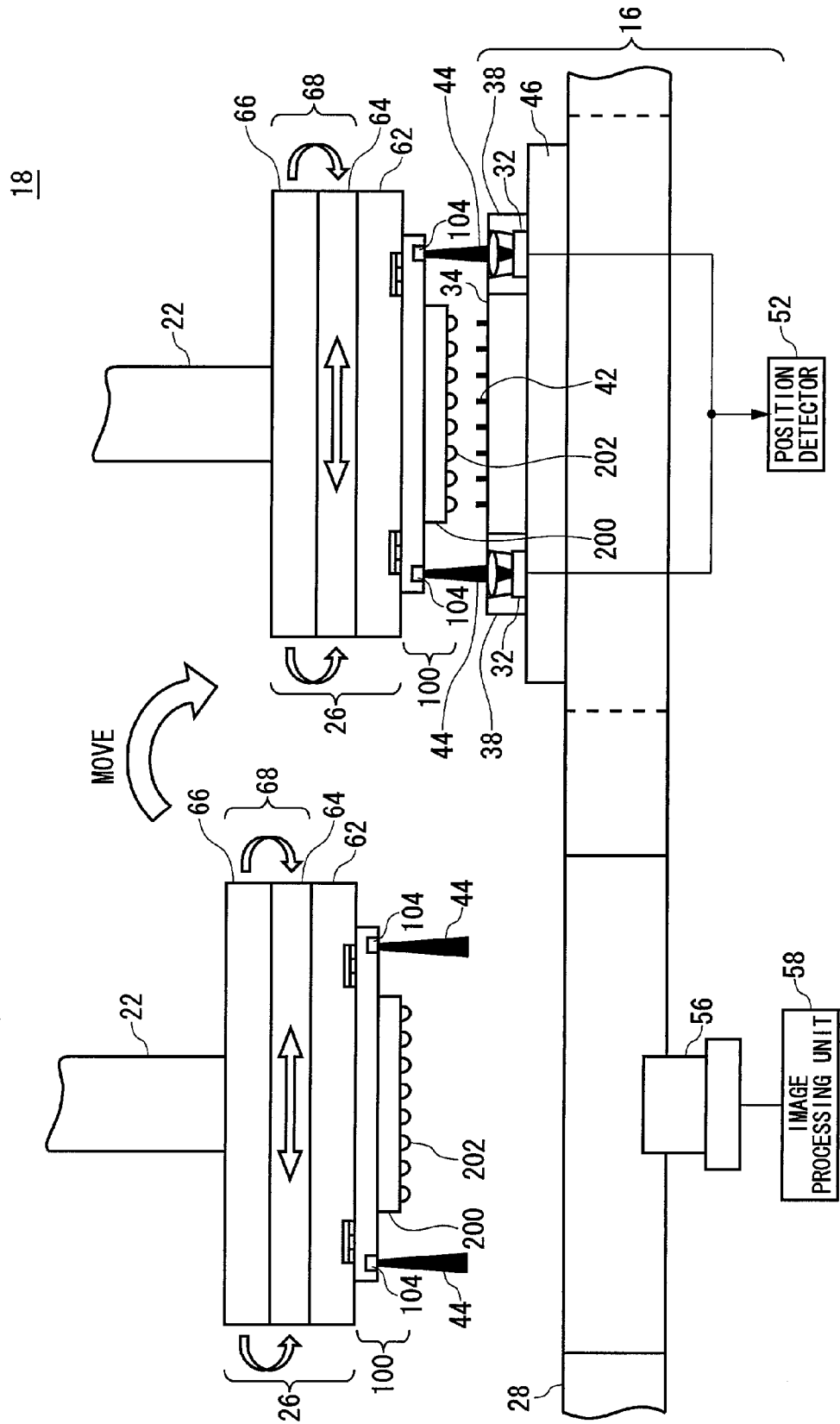
FIG. 10 shows still another exemplary structure of the electronic device carrying apparatus 18.

FIG. 10 shows still another example of the structure of the electronic device carrying apparatus 18. In this example, the electronic device carrying apparatus 18 further includes a capturing unit 56 and an image processing unit 58. Moreover, the electronic device placing unit 16 includes a plurality of optical detectors 32 and a position detector 52. In FIG. 10, the components labeled with the same reference numerals as those in FIGS. 3A and 3B or 8 have the same or similar functions as/to those in FIGS. 3A and 3B or 8, and therefore the description thereof is omitted.

In this example, the device holding unit 26 that holds the electronic device 100 moves to be positioned above the capturing unit 56 and adjusts the position of the electronic device 100. Then, the device holding unit 26 moves to be positioned above the electronic device placing unit 16, so as to adjust the position of the electronic device 100 in more detail.

It is preferable that the capturing unit 56 captures the emitted light 44 at a position away from the laser device 104 by a distance larger than the distance between the laser device 104 and the corresponding optical detector 32. In this case, by making rough arrangement by the capturing unit 56 and the image processing unit 58 and fine arrangement by the optical detector 32 and the position detector 52, the position of the electronic device 100 can be adjusted efficiently.

Figure 11:
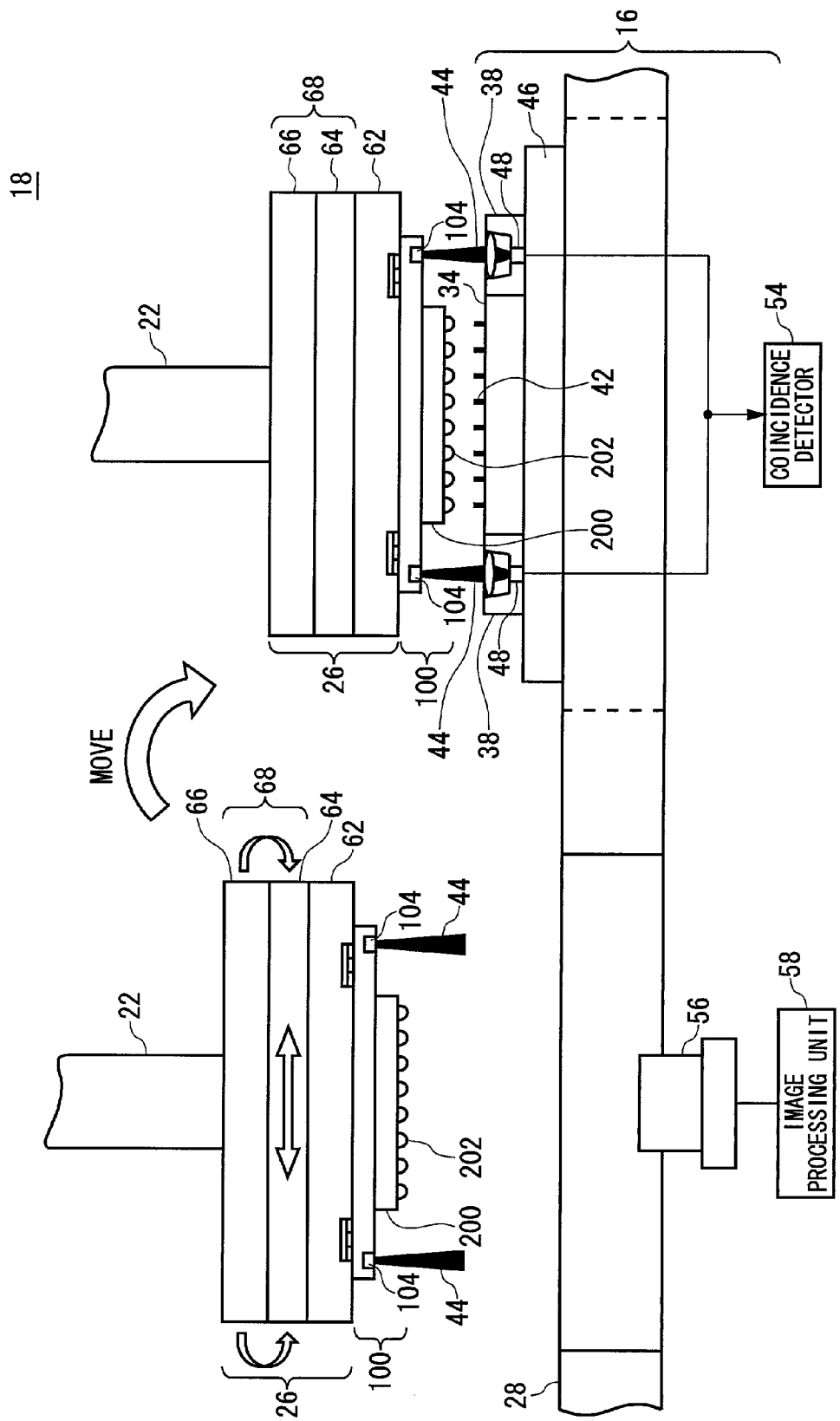
FIG. 11 shows still another exemplary structure of the electronic device carrying apparatus 18.

FIG. 11 shows still another example of the structure of the electronic device carrying apparatus 18. In this example, the electronic device carrying apparatus 18 further includes a capturing unit 56 and an image processing unit 58. Moreover, the electronic device placing unit 16 includes a plurality of optical detectors 32 and a coincidence detector 54. In FIG. 11, the components labeled with the same reference numerals as those in FIGS. 6A and 6B or FIG. 8 have the same or similar functions as/to those in FIGS. 6A and 6B or FIG. 8, and therefore the description thereof is omitted.

In this example, the device holding unit 26 that holds the electronic device 100 moves to be positioned above the capturing unit 56 and adjusts the position of the electronic device 100. Then, the device holding unit 26 moves to be positioned above the electronic device placing unit 16, and the coincidence detector 54 detects coincidence between the position of the electronic device 100 and a desired position. According to this example, the position of the electronic device 100 can be detected with high precision without fail.

Figure 12:
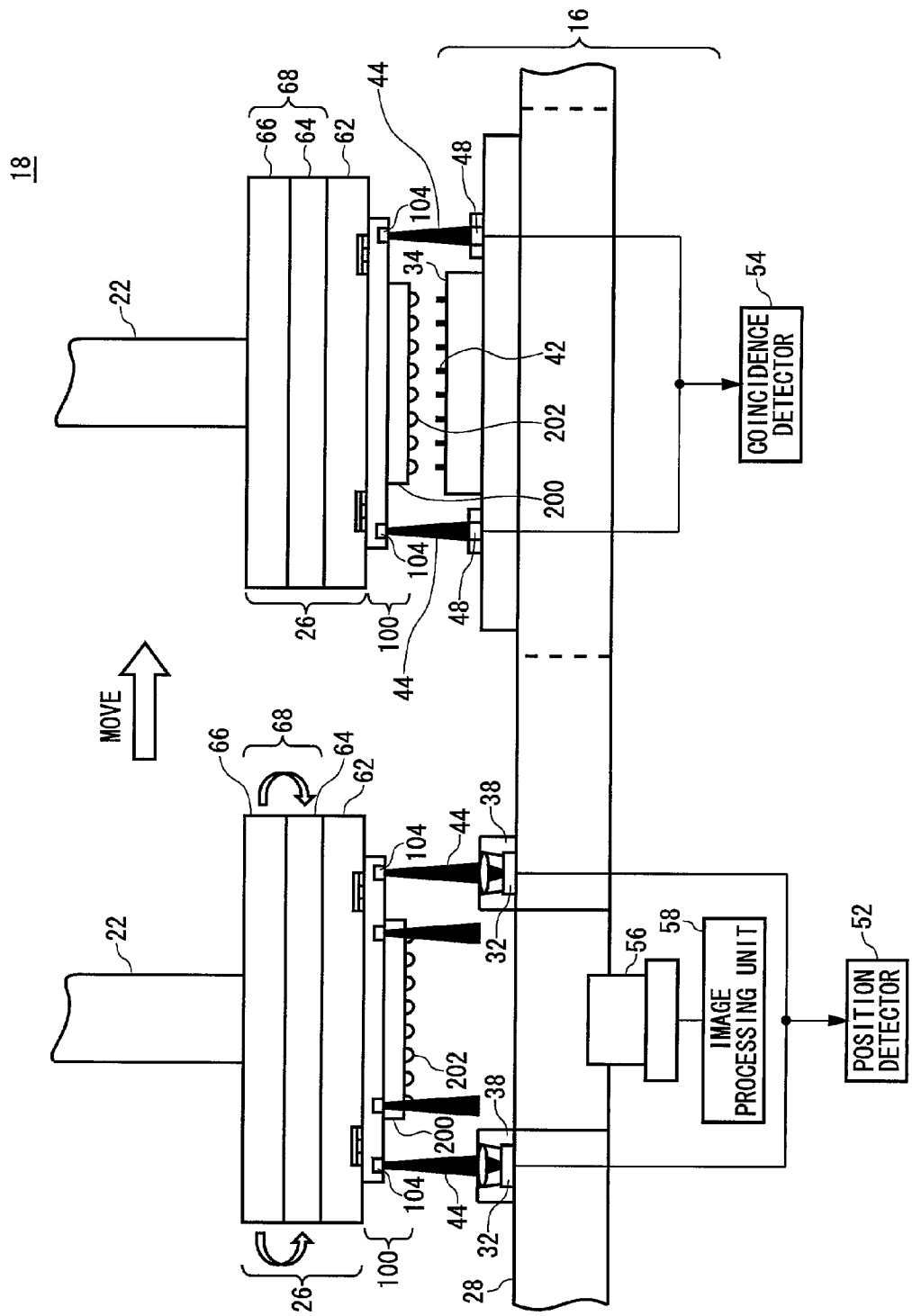
FIG. 12 shows still another exemplary structure of the electronic device carrying apparatus 18.

FIG. 12 shows still another example of the structure of the electronic device carrying apparatus 18. In this example, the electronic device carrying apparatus 18 further includes a capturing unit 56, an image processing unit 58, an optical detector 32 and a position detector 52. The electronic device 100 includes a plurality of laser devices 104 that emit light toward the capturing unit 56 and a plurality of laser devices 104 that emit light toward the optical detector 32. The electronic device placing unit 16 includes a plurality of photodiodes 48 and a coincidence detector 54. In FIG. 12, the components labeled with the same reference numerals as those in FIGS. 6A and 6B or FIG. 8 have the same or similar functions as/to those in FIGS. 6A and 6B or FIG. 8, and therefore the description thereof is omitted.

In this example, the device holding unit 26 that holds the electronic device 100 moves to be positioned above the capturing unit 56 and roughly adjusts the position of the electronic device 100 based on the result of the position detection by the image processing unit 58. After the rough adjustment, the device holding unit 26 further adjusts the position of the electronic device 100 based on the result of the position detection by the position detector 52 more finely. After the fine adjustment, the device holding unit 26 moves to be positioned above the electronic device placing unit 16, and the coincidence detector 54 detects coincidence between the position of the electronic device 100 and a desired position. According to the present example, the position of the electronic device 100 can be adjusted with higher precision without fail.

Figure 13:
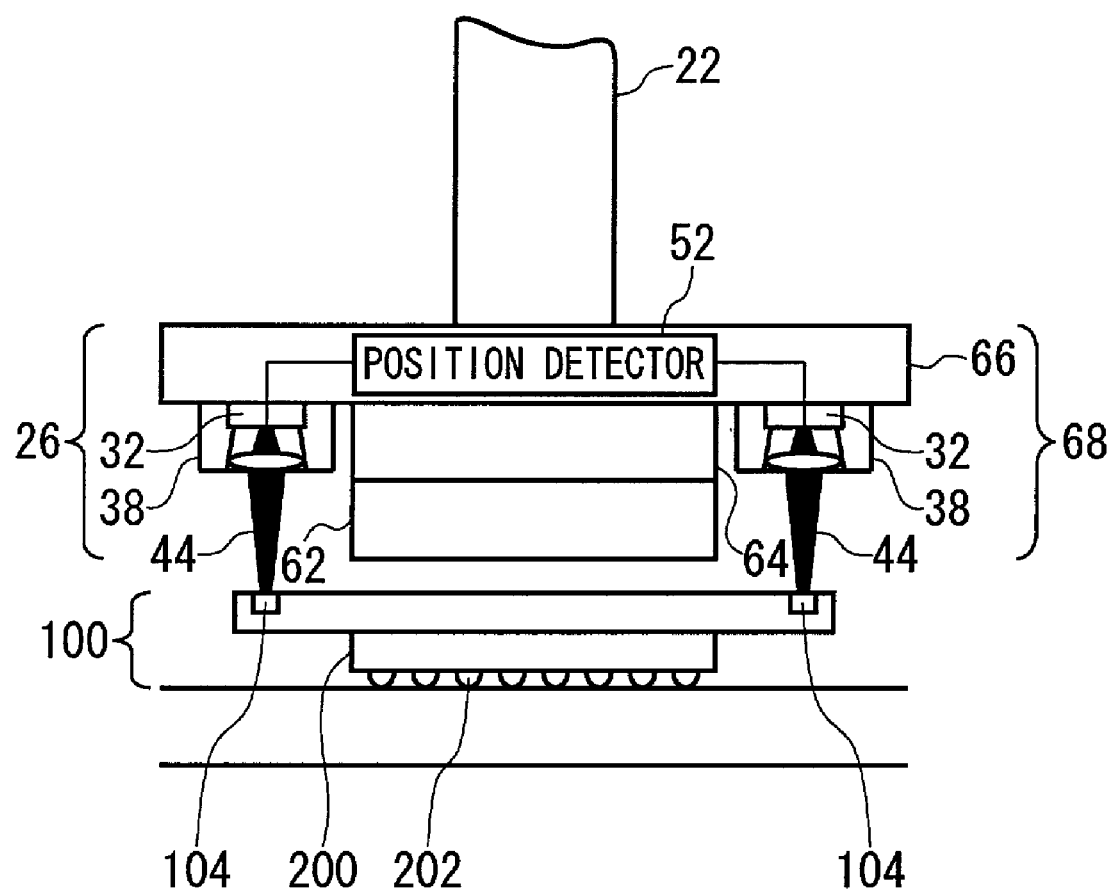
FIG. 13 shows another exemplary structure of the electronic device 100 and the device holding unit 26.

FIG. 13 shows another exemplary structure of the electronic device 100 and the device holding unit 26. In this example, a plurality of laser devices 104 are formed on the upper surface of the substrate for alignment 102. The device holding unit 26 includes a plurality of optical detectors 32 and a position detector 52.

Each of the optical detectors 32 is placed at a position in the lower surface of the adjustment fixing unit 66, that is to be directly above the corresponding one of the laser devices 104, and detects the emitted light 44 from the corresponding laser device 104. The position detector 52 detects the position of each laser device 104 by the corresponding optical detector 32, thereby detecting the position of the electronic device 100 based on the detected positions of the laser devices 104. In FIG. 13, the components labeled with the same reference numerals as those in FIG. 3 have the same or similar functions as/to those in FIG. 3, and therefore the description thereof is omitted.

FIGS. 14A and 14B show an exemplary operation of the device holding unit 26 described referring to FIG. 13. In this example, the device holding unit 26 first moves to be positioned above the tray 24 on which the electronic device 100 is placed.

Then, as shown in FIG. 14A, the device holding unit 26 above the tray 24 detects the position of the electronic device 100 that emits light 44 and adjusts the position of the adjustment moving unit 64 based on information regarding the detected position. The device holding unit 26 then absorbs the electronic device 100 so as to be hold the electronic device 100, as shown in FIG. 14B.

The device holding unit 26 then moves to be positioned above the electronic device placing unit 16 (see FIG. 3) and adjusts again the position of the electronic device 100 based on the known information regarding the position. According to this example, the position of the electronic device 100 can be adjusted with high precision.

Figure 15A:
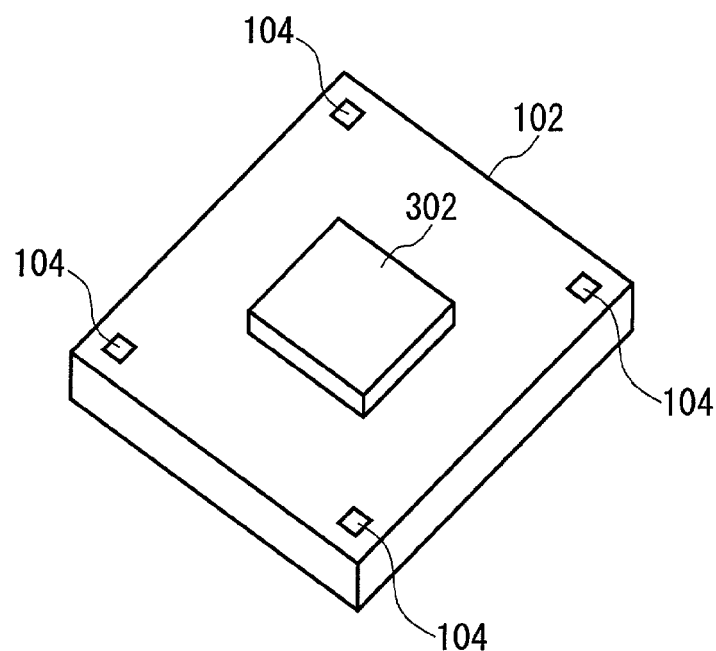
FIG. 15A shows an exemplary structure of the electronic device 100.
Figure 15B:
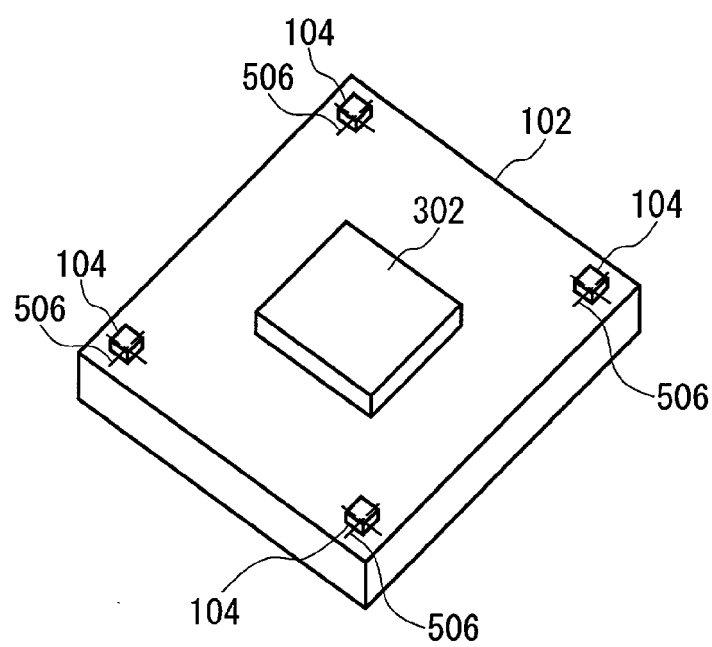
FIG. 15B shows an exemplary structure of the electronic device 100.

FIGS. 15A and 15B show another exemplary structure of the electronic device 100. In this example, the electronic device 100 includes a semiconductor device 302, a substrate for alignment 102 and a plurality of laser devices 104.

The semiconductor device 302 is a device in which a semiconductor circuit is formed and is an example of the device under test 200 described referring to FIG. 2. The semiconductor device 302 may be a semiconductor chip cut from semiconductor wafer, for example.

The substrate for alignment 102 is an example of the holding member that holds the semiconductor device 302 at a predetermined position in a detachable manner. The substrate for alignment 102 fixes the semiconductor device 302 by adhesion, absorption or the like. By placing the semiconductor device 302 on the upper surface of the substrate for alignment 102, the semiconductor device 302 may be fixed by the substrate for alignment 102. In this manner, the semiconductor device 302 is formed integrally with the substrate for alignment 102.

The substrate for alignment 102 is, for example, a semiconductor substrate or a dielectric substrate and is formed integrally with the laser devices 104. In this case, the laser devices 104 may be monolithic with the substrate for alignment 102 or may be placed on the surface of the substrate for alignment 102 in a detachable manner. In this way, the laser devices 104 are formed integrally with the substrate for alignment 102 and the semiconductor circuit 306, and emit light indicating a reference position of the semiconductor circuit 306.

The laser devices 104 may emit the light toward the optical detector 32 (see FIG. 3). In this case, the position detector 52 (see FIG. 3) can detect the position of the semiconductor device 302 as the semiconductor chip with high precision.

The substrate for alignment 102 and each of the laser devices 104 may have the same or similar functions as/to those described referring to FIG. 2. Moreover, the substrate for alignment 102 and each of the laser devices 104 may be parts of a fixing member for fixing the semiconductor device 302.

FIG. 15A shows an exemplary structure of the electronic device 100 in a case where the laser devices 104 are monolithic with the substrate for alignment 102. The substrate for alignment 102 may be a substrate of compound semiconductor such as GaAs, for example. The laser devices 104 may be formed on the substrate for alignment 102 by a semiconductor fabrication process.

FIG. 15B shows an exemplary structure of the electronic device 100 in a case where the laser devices 104 are placed on the substrate for alignment 102. The substrate for alignment 102 maybe a substrate of compound semiconductor such as GaAs, a silicon substrate, a dielectric substrate or a ceramic substrate, for example. It is preferable that the laser devices 104 be surface emitting lasers. In this case, each laser device 104 emits light in a direction perpendicular to the surface of the substrate for alignment 102.

The surface for alignment 102 has alignment marks 506 at positions where the laser devices 104 are placed, respectively. In this case, the laser devices 104 can be fixed with high precision. The alignment marks 506 may be formed by a semiconductor process such as photolithography and etching, for example. Moreover, each alignment mark 506 may indicate the center or circumference of a region where the corresponding laser device 104 is placed, for example.

Figure 16A:
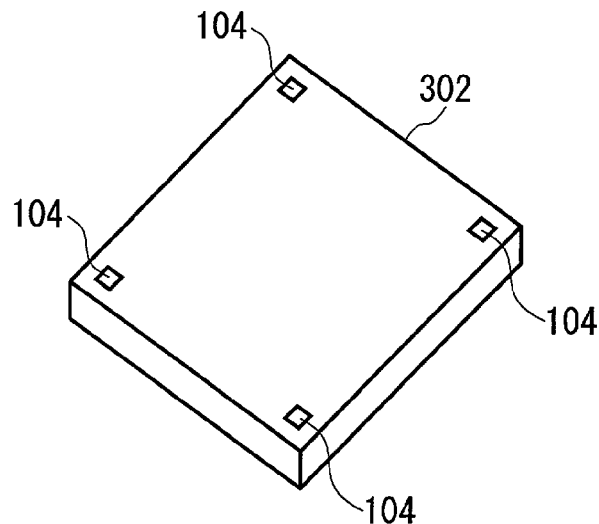
FIG. 16A shows a perspective view of the electronic device 100.
Figure 16B:
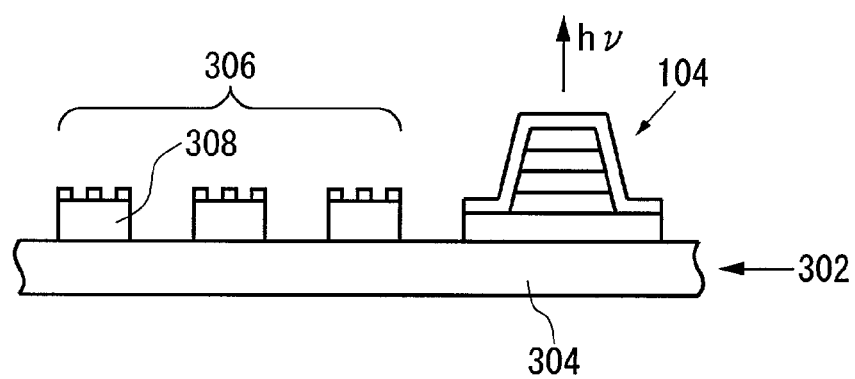
FIG. 16B shows an example of the detailed structure of the electronic device 100.
Figure 16C:
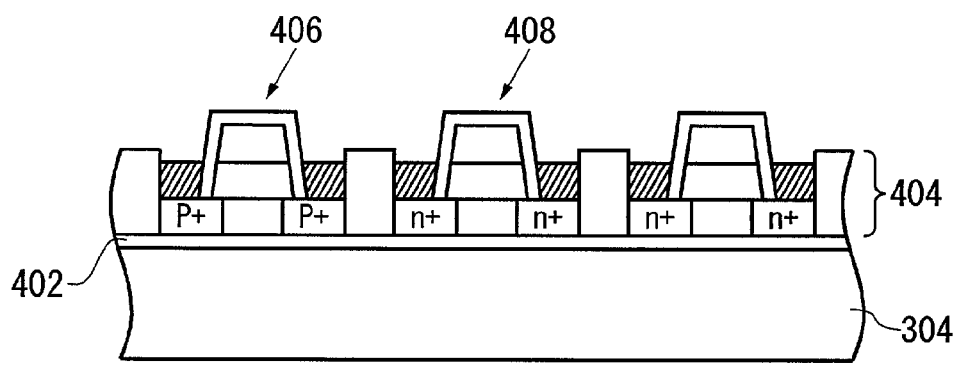
FIG. 16C shows an other exemplary structure of a semiconductor circuit 306.

FIGS. 16A, 16B and 16C shows still another example of the electronic device 100. FIG. 16A shows a perspective view of the electronic device 100. The electronic device 100 includes a semiconductor device 302 and a plurality of laser devices 104. In this example, the laser devices 104 are monolithic with the semiconductor device 302 and are formed on the semiconductor device 302 by a semiconductor fabrication process. In this way, the laser devices 104 are formed integrally with the semiconductor device 302 and generate light indicating the reference position of the semiconductor device 302. Thus, according to the present example, the position of the semiconductor device 302 can be detected with high precision.

FIG. 16B shows an exemplary detailed structure of the electronic device 100. In this example, the semiconductor device 302 has a semiconductor substrate 304 and a semiconductor circuit 306. The semiconductor substrate 304 maybe a substrate of compound semiconductor such as GaAs, for example. The semiconductor circuit 306 is an electronic circuit formed on the surface of the semiconductor substrate 304, and may be an integrated circuit including a plurality of HEMTs (High Electron Mobility Transistors) 308, for example.

The laser devices 104 are laser diodes formed on the surface of the semiconductor substrate 304 by epitaxial growth, for example. The laser devices 104 may include a plurality of layers formed by vapor phase growth, for example. These layers may be formed by a single fabrication process or a plurality of fabrication processes and may be formed by different material gases or dopants, respectively. It is preferable that the laser devices 104 be surface emitting lasers. Each laser device 104 has a slit or microlens that covers the light emitting surface of the laser device 104 on the uppermost layer thereof.

In this example, the laser devices 104 are formed on the semiconductor device 302 by a semiconductor process. Thus, according to the present example, the laser devices 104 can be formed at desired positions with high precision. Moreover, due to this, the position of the semiconductor device 302 can be detected with high precision.

It is preferable that the lighting circuit 82 (see FIG. 3) of the laser device 104 is electrically independent of the semiconductor circuit 306. In this case, even in a case where the semiconductor circuit 306 is defective, for example, the laser device 104 can be lighted and it is therefore possible to appropriately test the electronic device 100. The lighting circuit 82 may be electrically independent of the semiconductor device 302.

In this example, a circuit formation process for forming the semiconductor circuit 306 is performed prior to a laser formation process for forming the laser devices 104. In this case, the semiconductor circuit 306 may be covered by a protection layer prior to the laser formation process. The protection layer may be removed after the laser formation process. In this case, it is possible to prevent the laser devices 104 from being damaged during the circuit formation process.

In an alternative example, the laser formation process may be performed prior to the circuit formation process. In this case, alignment in the circuit formation process can be performed by light emission by the laser devices 104. Moreover, a part of the laser formation process may be performed simultaneously with a part of the circuit formation process. In this case, the fabrication process can be simplified.

FIG. 16C shows another example of the structure of the semiconductor circuit 306. In this example, the semiconductor circuit 306 includes an insulation layer 402 and a polysilicon layer 404.

The insulation layer 402 is an exemplary buffer layer formed between the semiconductor substrate 304 and the polysilicon layer 404. The insulation layer 402 may be a layer of silicon oxide formed on the semiconductor substrate 304, for example. In this way, the polysilicon layer 404 can be formed on the semiconductor substrate 304 formed of, for example, GaAs.

The polysilicon layer 404 is an exemplary silicon layer formed on the semiconductor substrate 304, and includes a PMOS transistor 406 and an NMOS transistor 408 on the surface thereof, for example. In this case, a CMOS circuit having small power consumption can be formed monolithically with the laser devices 104. Please note that the semiconductor circuit 306 maybe formed after the laser devices 104 were formed on the semiconductor substrate 304.

Figure 17:
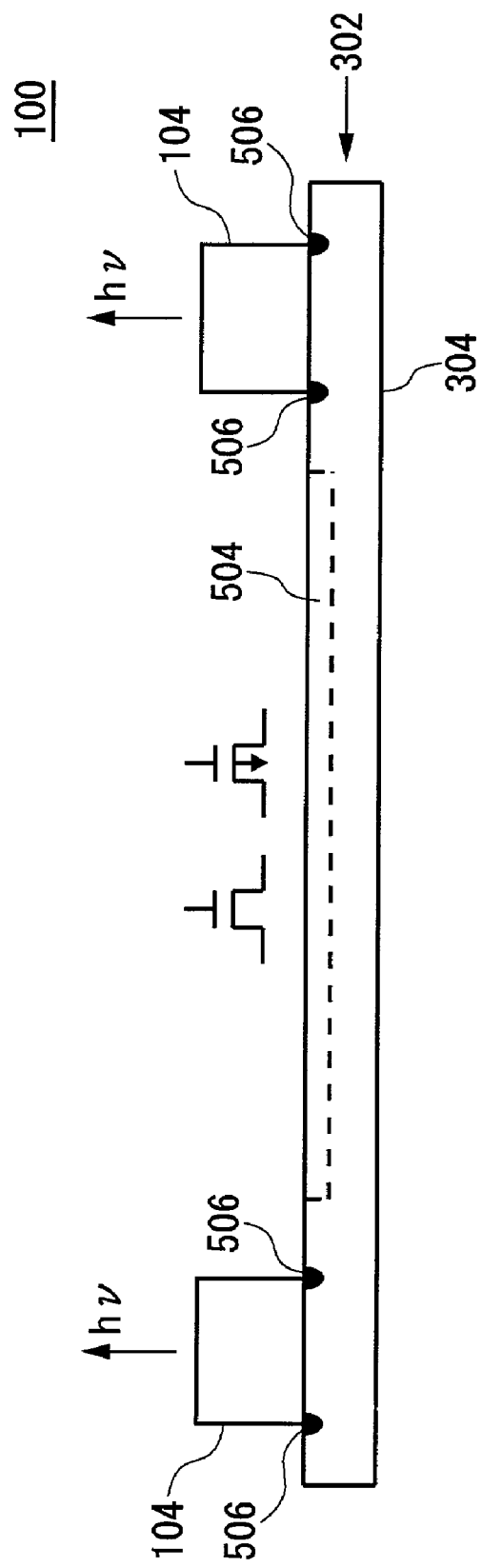
FIG. 17 shows still another example of the electronic device 100.

FIG. 17 shows still another example of the electronic device 100. In this example, the electronic device 100 includes a semiconductor device 302 and a plurality of laser devices 104. In this example, the laser devices 104 are placed on the surface of the semiconductor device 302. In this way, the laser devices 104 are formed integrally with the semiconductor device 302 and emit light indicating a reference position of the semiconductor device 302. Also in this case, the position of the semiconductor device 302 can be detected with high precision.

The laser devices 104 may be laser diodes formed of GaAs, for example. The laser devices 104 are cut into the respective devices by dicing after the formation of the laser devices 104 on the GaAs substrate.

In this case, it is preferable that the laser formation process for fabricating the laser devices 104 include a classification process. The classification process may classify the laser devices 104 after the dicing process by performing a lighting test that checks whether or not the laser device 104 emits light having a predetermined intensity, for example. Moreover, the classification process may classify the laser devices 104 after the dicing process by performing an appearance check that checks the required precision. In this way, the position of the semiconductor device 302 can be detected with higher precision. In addition, the laser devices 104 may be joined with the semiconductor device 302 by, for example, soldering, electroconductive paste or heat adhesion.

The semiconductor device 302 may be a semiconductor chip, for example, and may have the same or similar function as/to that of the semiconductor device 302 described referring to FIGS. 15A and 15B. In this example, the semiconductor device 302 includes a semiconductor substrate 304 and a semiconductor circuit 504. The semiconductor substrate 304 may be a silicon substrate, for example. The semiconductor circuit 504 may be an electronic circuit formed on the semiconductor device 302, such as a CMOS circuit, for example.

The semiconductor substrate 304 has alignment marks 506 at positions where the laser devices 104 are respectively placed. In this case, the laser devices 104 can be fixed with high precision.

Figure 18A:
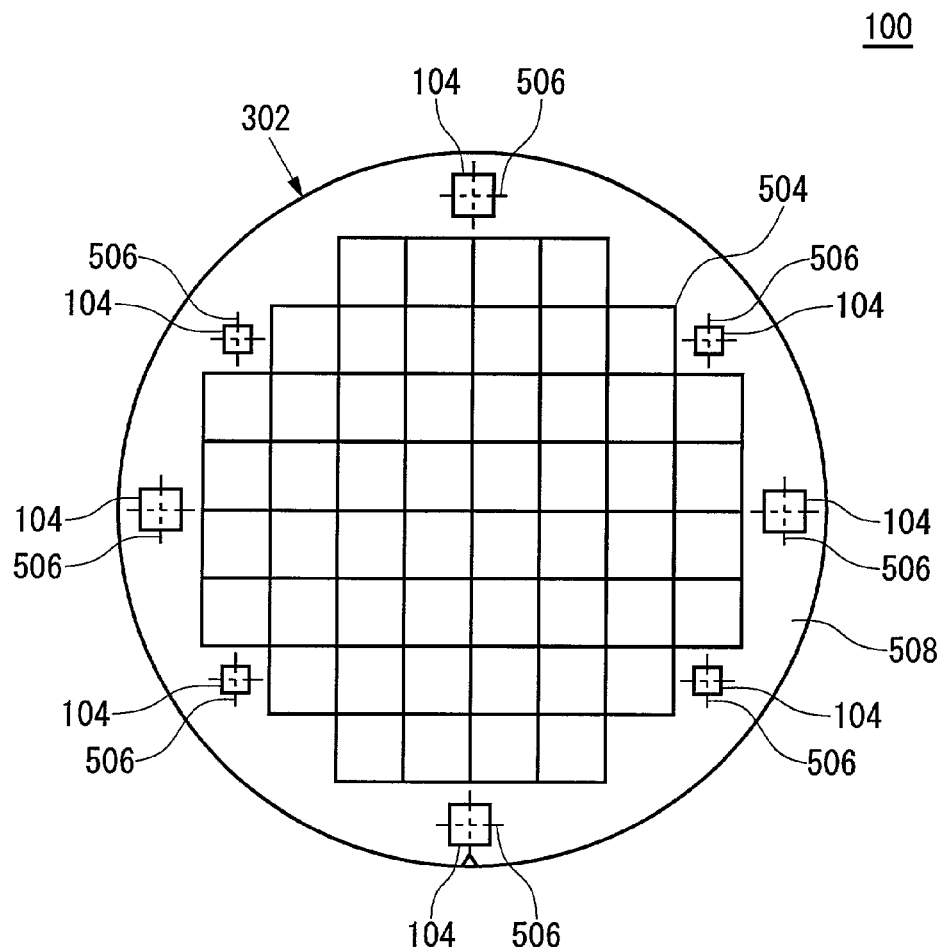
FIG. 18A shows a top view of the electronic device 100.
Figure 18B:
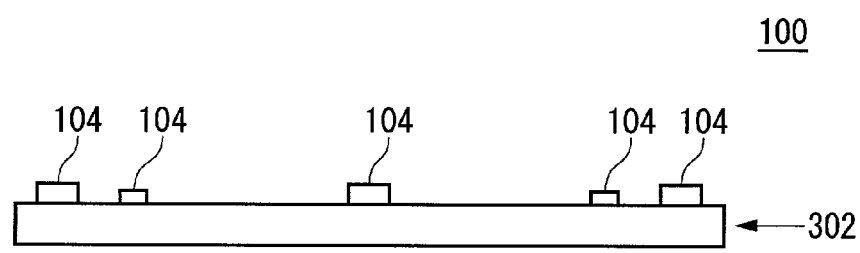

FIGS. 18A and 18B show still another example of the electronic device 100. FIG. 18A shows a top view of the electronic device 100 while FIG. 18B shows a side view thereof.

In this example, the semiconductor device 302 is semiconductor wafer having a plurality of semiconductor circuits 504 formed thereon that is to be separated into a plurality of chips. The semiconductor device 302 that is the semiconductor wafer includes a cut-off region 508 that is located in the outside of an area where the semiconductor circuits 504 are formed.

In this example, a plurality of laser devices 104 are placed in the cut-off region 508 and are therefore formed integrally with the semiconductor wafer. In this case, a number of semiconductor circuits 504 can be formed on the semiconductor wafer efficiently. In addition, the laser devices 104 are placed on the front surface of the semiconductor device 302.

In this case, it is possible to bring the back face of the semiconductor device 302 into contact with a flat face, thereby fixing the semiconductor device 302 stably. The laser devices 104 may be placed on the face of the semiconductor device 302 on which the semiconductor circuits 504 are to be formed.

According to this example, based on the light emission by the laser devices 104, the position of the semiconductor device 302 that is the semiconductor wafer can be detected with high precision. In this way, it is possible to make alignment of the semiconductor device 302 and then perform lithography, dicing or a wafer test, for example. In this way, the semiconductor circuits 504 can be formed with high precision.

Please note that the laser devices 104 may emit light toward the optical detector 32 (see FIG. 3). In this case, the position detector 52 (see FIG. 3) can detect the position of the semiconductor device 302 that is the semiconductor wafer with high precision. Moreover, the electronic device 100 may include a large-sized laser device 104 and a small-sized laser device 104. In this case, it is possible to roughly detect the position of the electronic device 100 based on the light emitted by the large-sized laser device 104 and then finely detect the position of the electronic device 100 based on the light emitted by the small-sized laser device 104. It should be noted that the components in FIGS. 18A and 18B labeled with the same reference numerals as those in FIG. 17 may have the same or similar functions as/to the components in FIG. 17.

Figure 19A:
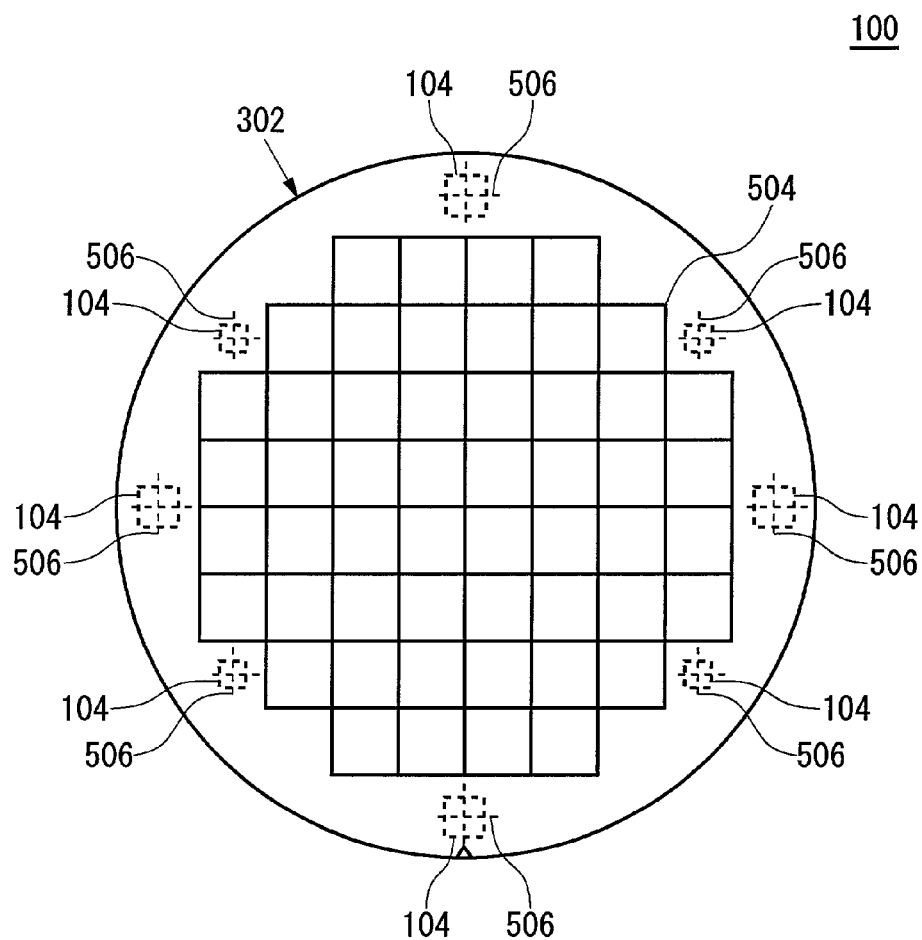
FIG. 19A shows a top view of the electronic device 100.
Figure 19B:
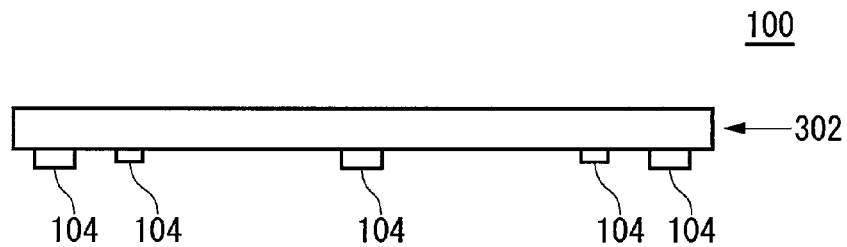
FIG. 19B shows a side view of the electronic device 100.

FIGS. 19A and 19B show still another example of the electronic device 100. FIG. 19A shows a top view of the electronic device 100 while FIG. 19B shows a side view thereof. In this example, the laser devices 104 are placed on a back surface of the semiconductor device 302, that is opposite to the front surface on which the semiconductor circuits 504 are formed. In this case, possible damage of the laser devices 104 during the process for forming the semiconductor circuits 504 can be reduced.

It is preferable that the laser devices 104 emit infrared light or far-infrared light. In this case, the laser devices 104 may emit in a direction in which the light transmits the semiconductor device 302. The laser devices 104 may emit in a direction from the back surface of the semiconductor device 302 to the surface thereof on which the semiconductor circuits 504 are formed. It should be noted that the components in FIGS. 19A and 19B labeled with the same reference numerals as those in FIGS. 18A and 18B may have the same or similar functions as/to the components in FIGS. 18A and 18B.

Figure 20A:
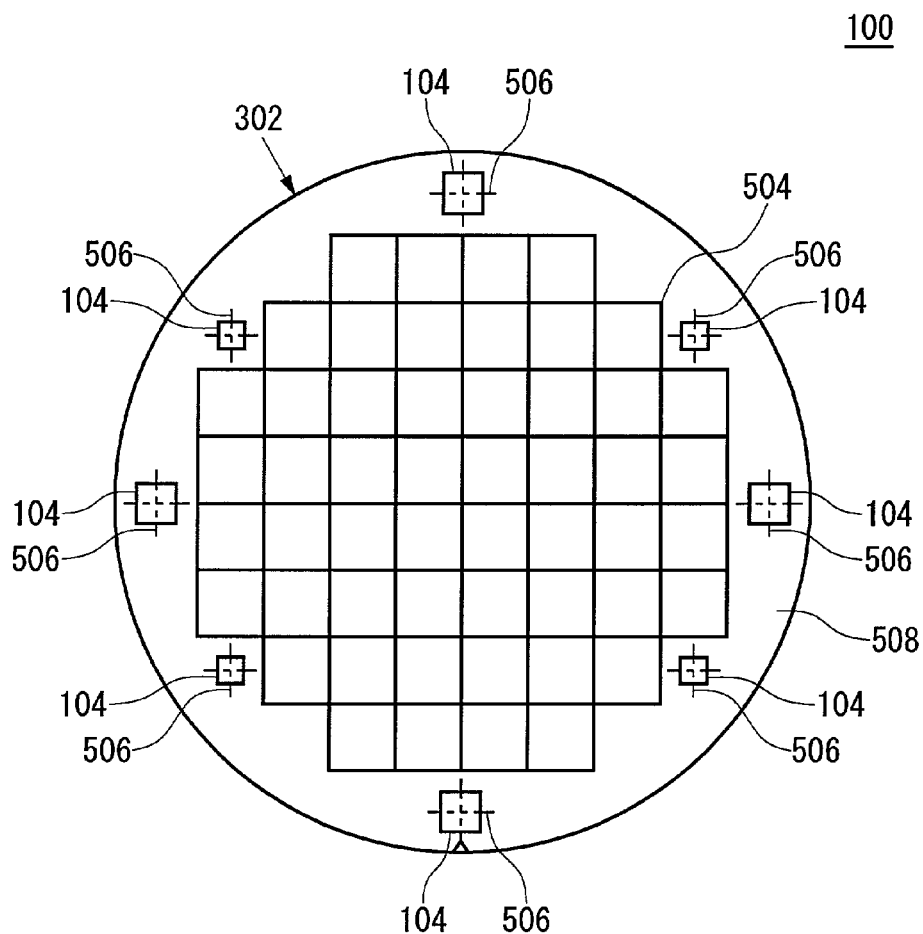
FIG. 20A shows a top view of the electronic device 100.
Figure 20B:
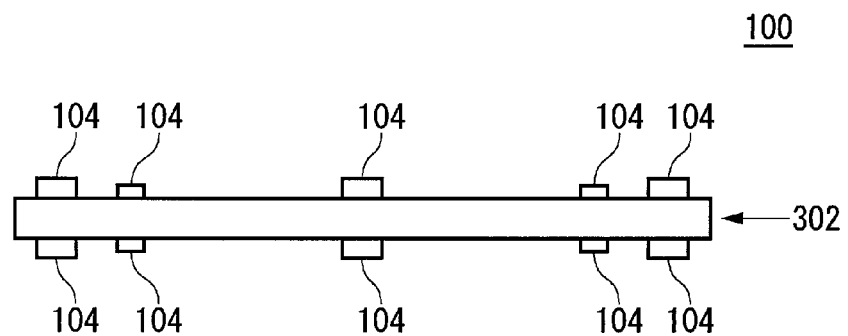
FIG. 20B shows a side view of the electronic device 100.

FIGS. 20A and 20B show still another example of the electronic device 100. FIG. 20A shows a top view of the electronic device 100 while FIG. 20B shows a side view thereof. In this example, the electronic device 100 includes laser devices 104 placed on a front surface of the semiconductor device 302 and laser devices 104 placed on a back surface of the semiconductor device 302. In this case, the position of the semiconductor device 302 can be detected from each of the front and back surfaces of the semiconductor device 302. In this way, it is possible to detect the position of the semiconductor device 302 with higher precision. It should be noted that the components in FIGS. 20A and 20B labeled with the same reference numerals as those in FIGS. 18A and 18B may have the same or similar functions as/to the components in FIGS. 18A and 18B.

Figure 21A:
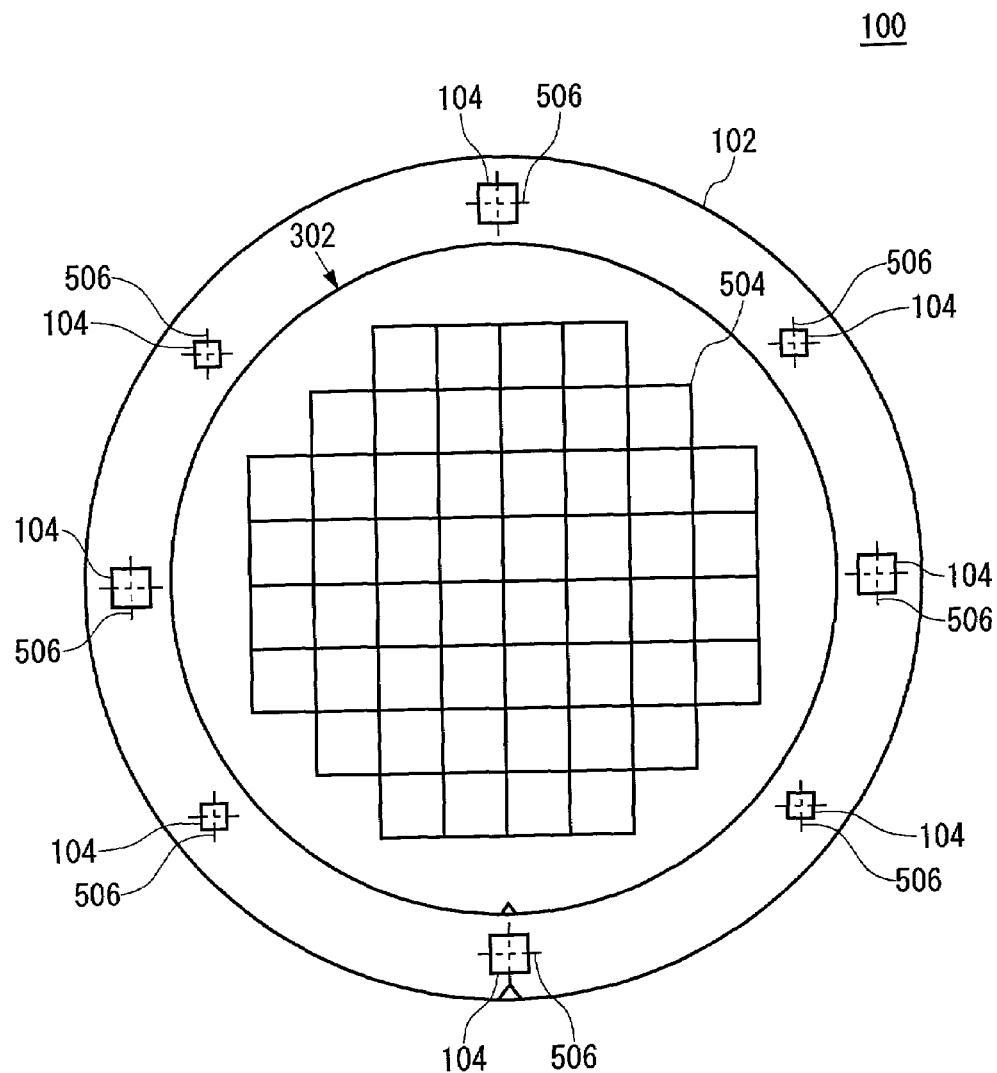
FIG. 21A shows a top view of the electronic device 100.
Figure 21B:
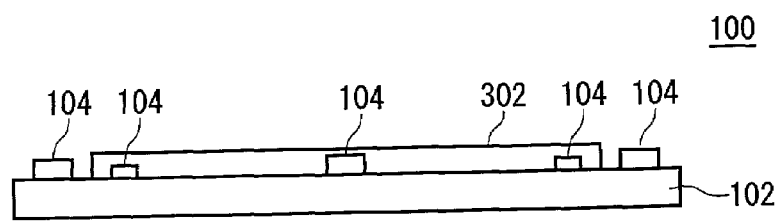
FIG. 21B shows a side view of the electronic device 100.

FIGS. 21A and 21B show still another example of the electronic device 100. FIG. 21A shows a top view of the electronic device 100 while FIG. 21B shows a side view thereof. In this example, the semiconductor device 302, that is semiconductor wafer, is placed on the substrate for alignment 102. The substrate for alignment 102 may have the same or similar function as/to that of the substrate for alignment 102 described referring to FIGS. 15A and 15B. Also in this example, the position of the semiconductor device 302 can be detected with high precision. It should be noted that the components in FIGS. 21A and 21B labeled with the same reference numerals as those in FIGS. 18A and 18B may have the same or similar functions as/to the components in FIGS. 18A and 18B.

Figure 22:
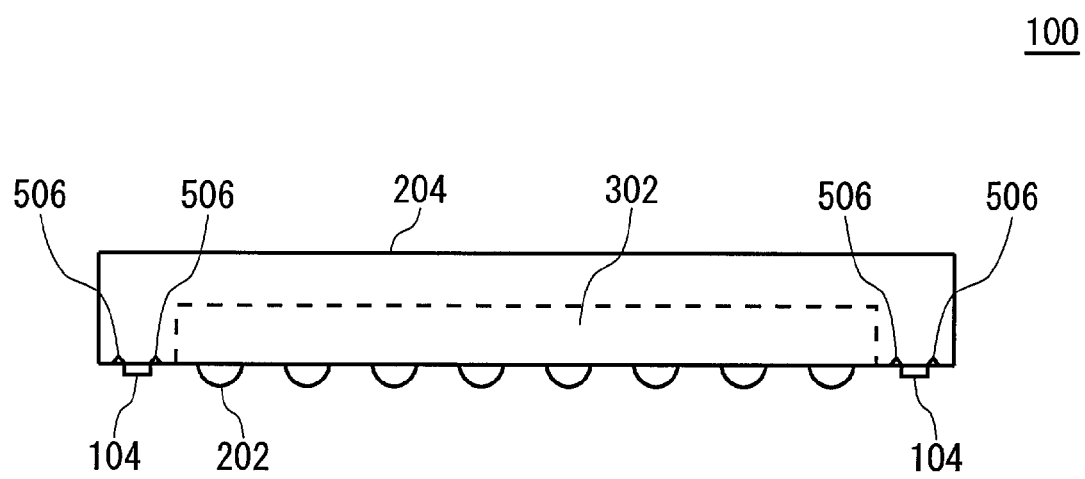
FIG. 22 shows still another example of the electronic device 100.

FIG. 22 shows still another example of the electronic device 100. In this example, the electronic device 100 includes a semiconductor device 302, a package 204 and a plurality of laser devices 104.

The package 204 is an exemplary holding member that holds the semiconductor device 302 at a predetermined position, and holds the semiconductor device 302 while accommodating it therein. The laser devices 104 are placed on the package 204 by adhesion, for example to be fixed to the package 204. In this case, the laser devices 104 may be placed in the outside of the package 204. In this way, the laser devices 104 are formed integrally with the package 204 and the semiconductor device 302 and emit light indicating a reference position of the semiconductor circuit 306. Thus, also in this example, the position of the semiconductor circuit 306 can be detected with high precision. In addition, the package 204 has alignment marks 506 at positions where the laser devices 104 are to be placed, respectively. Moreover, it is preferable that the height of the laser device 104 be lower than the height of the terminal 202.

As is apparent from the above description, according to the present invention, the position of the electronic device can be detected with high precision.

Although the present invention has been described by way of exemplary embodiments, it should be understood that those skilled in the art might make many changes and substitutions without departing from the spirit and the scope of the present invention which is defined only by the appended claims.

What is claimed is:

1. An electronic device in which a semiconductor circuit is formed, comprising:
   a semiconductor device comprising said semiconductor circuit formed therein; and
   a plurality of light emitting devices formed integrally with said semiconductor device, said light emitting devices being operable to emit light,
   wherein said light emitted from the light emitting devices indicates a reference position of said semiconductor device,
   wherein said semiconductor device comprises a body,
   wherein said light emitting devices are attached to a periphery of said body and emit said light towards a light receiving device that is to detect a position of said semiconductor device, and
   wherein the semiconductor device is optically and electrically independent from the plurality of light emitting devices.

2. An electronic device as claimed in claim 1, wherein said light emitting devices are placed on one of surfaces of said semiconductor device.

3. An electronic device as claimed in claim 2, wherein said light emitting devices are placed on a front surface of said semiconductor device.

4. An electronic device as claimed in claim 2, wherein said light emitting devices are placed on a back surface of said semiconductor device.

5. An electronic device as claimed in claim 2, wherein said semiconductor device has an alignment mark at a position at which said light emitting devices are placed.

6. An electronic device as claimed in claim 1, wherein said light emitting devices are monolithic with said semiconductor device.

7. An electronic device as claimed in claim 1, wherein a lighting circuit of said light emitting devices is electrically independent of said semiconductor circuit.

8. An electronic device as claimed in claim 2, wherein said semiconductor device is semiconductor wafer having a plurality of semiconductor circuits formed thereon that is to be separated into a plurality of chips, and said light emitting devices emit said light towards said light receiving device that is to detect a position of said semiconductor wafer.

9. An electronic device as claimed in claim 8, wherein said light emitting devices are formed in a cut-off region of said semiconductor wafer located outer than an area where said plurality of semiconductor circuits are formed.

10. An electronic device as claimed in claim 1, wherein said light emitting devices are placed on each of both surfaces of said semiconductor device.

11. An electronic device as claimed in claim 1, wherein said light emitting devices emit said light in a direction in which said light transmits said semiconductor device.

12. An electronic device as claimed in claim 1, wherein said semiconductor device is a semiconductor chip cut from semiconductor wafer, and said light emitting devices emit said light towards a light receiving device that is to detect a position of said semiconductor chip.

13. An electronic device as claimed in claim 1, further comprising a holding member, formed integrally with said light emitting devices, operable to hold said semiconductor device at a predetermined position.

14. An electronic device as claimed in claim 13, wherein said holding member holds said semiconductor device in a detachable manner.

15. An electronic device as claimed in claim 13, wherein said holding member is a semiconductor substrate, and said light emitting devices are monolithic with said holding member.

16. An electronic device as claimed in claim 13, wherein said holding member is a semiconductor substrate, and said light emitting devices are placed on a surface of said holding member.

17. An electronic device as claimed in claim 16, wherein said light emitting devices are placed on said surface of said holding member in a detachable manner.

18. An electronic device as claimed in claim 16, wherein said holding member has an alignment mark at a position at which said light emitting devices are placed.

19. An electronic device as claimed in claim 13, wherein said holding member is a package operable to accommodate said semiconductor device, and said light emitting devices are placed on said package.

20. A fixing member for fixing a semiconductor device having a semiconductor circuit formed therein, comprising:
   a holding member operable to hold said semiconductor device at a predetermined position; and
   a plurality of light emitting devices formed integrally with said holding member, said light emitting devices being operable to emit light, wherein said light emitted from the light emitting devices indicates a reference position of said semiconductor device, wherein said semiconductor device comprises a body, wherein said light emitting devices are attached to a periphery of said body and emit said light towards a light receiving device that is to detect a position of said semiconductor device, and wherein the semiconductor device is optically and electrically independent from the plurality of light emitting devices.

21. An electronic device in which a semiconductor circuit is formed, manufactured by a semiconductor fabrication process, comprising:

step for providing a semiconductor device; and step for forming a plurality of laser devices on the semiconductor device so as to be monolithic with the semiconductor device, wherein said laser devices emit light towards a light receiving device that is to detect a position of said semiconductor device, and wherein the semiconductor device is optically and electrically independent from the plurality of light emitting devices.

* * * * *